United States Patent [19]
Darnell et al.

[11] Patent Number: 5,790,062
[45] Date of Patent: Aug. 4, 1998

[54] DELTA MODULATOR WITH PSEUDO CONSTANT MODULATION LEVEL

[75] Inventors: Brad Darnell, San Jose; Rouben Toumani; Paul Bauer, both of Morgan Hill, all of Calif.

[73] Assignee: Wiltron Company, Morgan Hill, Calif.

[21] Appl. No.: 653,933

[22] Filed: May 23, 1996

[51] Int. Cl.[6] .................................................. H03K 13/00
[52] U.S. Cl. ........................................ 341/143; 375/242
[58] Field of Search .................................. 341/143, 144, 341/155; 375/242, 243, 250–254

[56] References Cited

U.S. PATENT DOCUMENTS

| | | | |
|---|---|---|---|
| 3,815,033 | 6/1974 | Tewksbury | 329/104 |
| 3,949,299 | 4/1976 | Song | 325/38 B |
| 4,025,852 | 5/1977 | Ching | 325/38 |
| 4,123,709 | 10/1978 | Dodds et al. | 325/38 |
| 4,151,517 | 4/1979 | Kelley | 340/347 |
| 4,646,322 | 2/1987 | Flanagin et al. | 375/27 |
| 4,654,815 | 3/1987 | Marin et al. | 364/606 |
| 5,187,482 | 2/1993 | Tiemann et al. | 341/143 |

OTHER PUBLICATIONS

IEEE Catalogue No. 75 CHO 971–2 CSCB; vol. III Instit. of Electrical & Electronics Engineers, Inc. ICC75; Signal Processing in SLC–40, A 40 Channel Rural Subscriber Carrier. The Bell System Technical Journal, vol. 49, Mar. 1970, No. 3; Adaptive Delta Modulation with a One–Bit Memory, by N.S. Jayant.
Motorola Communication Device Data, Article 1, pp. 4–17–4–20.
Motorola Communication Device Data, MC34115, pp. 2–402–2–416.
Motorola Semiconductor Technical Data, MC3417; MC3418; MC3517; MC3518, pp. 2–101–2–118.
Harris Semiconductor, HC–55564 Continuously Variable Slope Delta–Modulator (CVSD), pp. 8–147–8–152, 8–144–8–146, 10–204–10–213 (1993).
Linear and Adaptive Delta Modulation, by J.E. Abate, Proceedings of the IEEE, vol. 55, No. 3, Mar., 1967.
The Application of Delta Modulation to Analog–to–PCM Encoding by David J. Goodman, The Bell System Technical Journal, vol. 48, Feb. 1969, No. 2.
Delta Modulation Codec for Telephone Transmission and Switching Applications, by R.R. Laane and B.T. Murphy, The Bell System Technical Journal, Jul.–Aug., 1970.
On Delta Modulation by David Slepian; The Bell System Technical Journal, vol. 51, Dec., 1972, No. 10.
Slope Overload Noise in Linear Delta Modulators With Gaussian Inputs; by L.J. Greenstein, The Bell System Technical Journal; vol. 52, No. 3, Mar., 1973.
Digital Coding of Speech Waveforms: PCN, DPCM, and DM Quantizers, by Nuggehally S. Jayant, Proceedings of the IEEE, vol. 62, No. 5, May 1974.
Double–Loop Sigma–Delta Modulation with dc Input, by Ning He, Federico Kuhlmann, and Andres Buzo; IEEE Transactions on Communications, vol. 38, No. 4, Apr. 1990.
Adaptive Delta Modulation for Companded PCM Coding and Decoding, by Dan C. Song, IEEE Transactions on Communications, May 1977.

(List continued on next page.)

*Primary Examiner*—Jeffrey A. Gaffin
*Assistant Examiner*—Peguy JeanPierre
*Attorney, Agent, or Firm*—Fliesler, Dubb, Meyer & Lovejoy

[57] ABSTRACT

The present invention is directed to delta modulation in which the modulation level is optimized to improve overall system performance. A delta modulator in accordance with the invention includes a step size controller having a overload detector, a step size generator and a modulation level regulator. The overload detector monitors the output serial bit stream and produces a signal indicative of whether overload conditions are present. The step size generator produces steps of varying sizes in response to an input signal. The modulation level regulator monitors the signal output from the overload detector and outputs a modulated signal when the overload detector output has reached at least a certain threshold level. The modulation level regulator output is received at the step size generator input.

37 Claims, 31 Drawing Sheets

OTHER PUBLICATIONS

Time–Shared Codecs for Multichannel Delta Modulation and Differential PCM, by Frank S. Boxall, IEEE Transactions on Communications, vol. COM–23, No. 3, Mar. 1975.

Linear, Nonlinear, and Adaptive Delta Modulation, Hans R. Schindler, IEEE Transactions on Communications, vol. COM–22, No. 11, Nov. 1974.

Multipurpose Hardware for Digital Coding of Audio Signals, by James D. Johnston and Davis J. Goodman, IEEE Transactions on Communications, vol. COM–26, No. 11, Nov. 1978.

Adaptive Prediction for Speech Encoding by Jerry D. Gibson, IEEE ASSP Magazine, Jul. 1984.

Arithmetic Ternary Operations on Delta–Modulated Signals and Their Application in the Realization of Digital Filters by D. Zrilic, A. Mavretic and M. Freedman; IEEE Transactions on Acoustics, vol. ASSP–33, No. 3, Jun. 1985.

Embedded Delta Modulation by Ian James Wassell, David J. Goodman, and Raymond Steele, IEEE Transactions on Acoustics, vol. 36, No. 8, Aug. 1988.

A Discretely Adaptive Delta Modulation Codec by K. Niwa, A. Yukawa, and A. Tomozawa, IEEE Transactions on Communications, vol. COM–29, No. 2, Feb. 1981.

A Variable–Step–size Robust Delta Modulator by C. Song, J. Garodnick, and D. Schilling. IEEE Transactions on Communications, vol. COM–19, No. 6, Dec. 1971.

Nearly Instantaneous Companding for Nonuniformly Quantized PCM, by Donald Duttweiler, IEEE Transactions on Communications, vol. COM24, No. 8, Aug. 1976.

Variable Bandwidth Adaptive Delta Modulation, by J.O. Smith and J.B. Allen, The Bell System Technical Journal, vol. 60, No. 5, May–Jun. 1981.

A Delta Modulation Filter for Speech–Type Signals by Dimitrios P. Prezas and Joseph L. Locicero, IEEE Transactions on Communications, vol. COM28, No. 6, Jun. 1980.

A Low Delay 16 kb/s Speech Coder by Vasu Iyengar and Peter Kabal, IEEE Transactions on Signal Processing, vol. 39, No. 5, May, 1991.

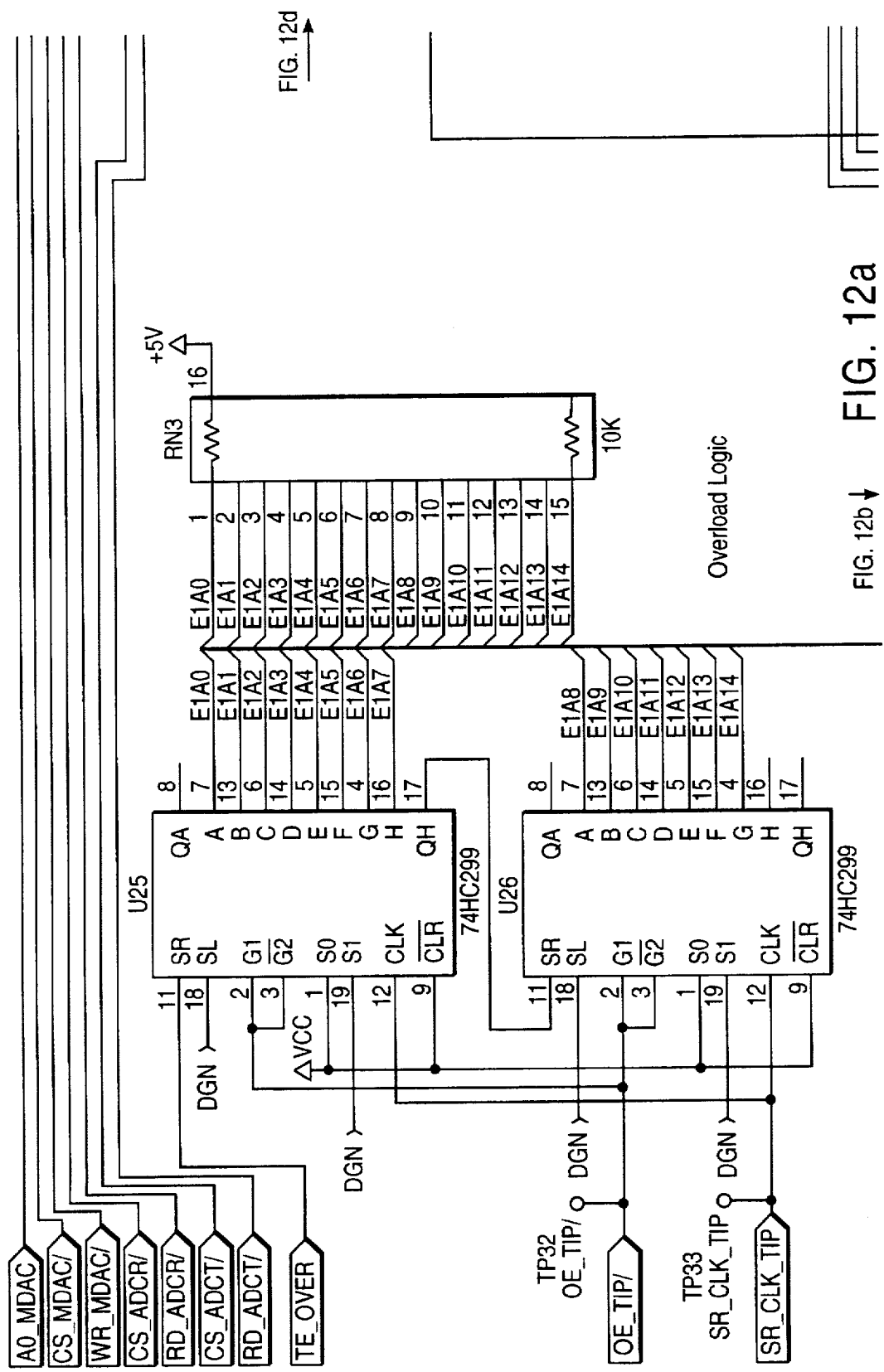

Nonlinear Squaring Function

FIG. 12d ↓

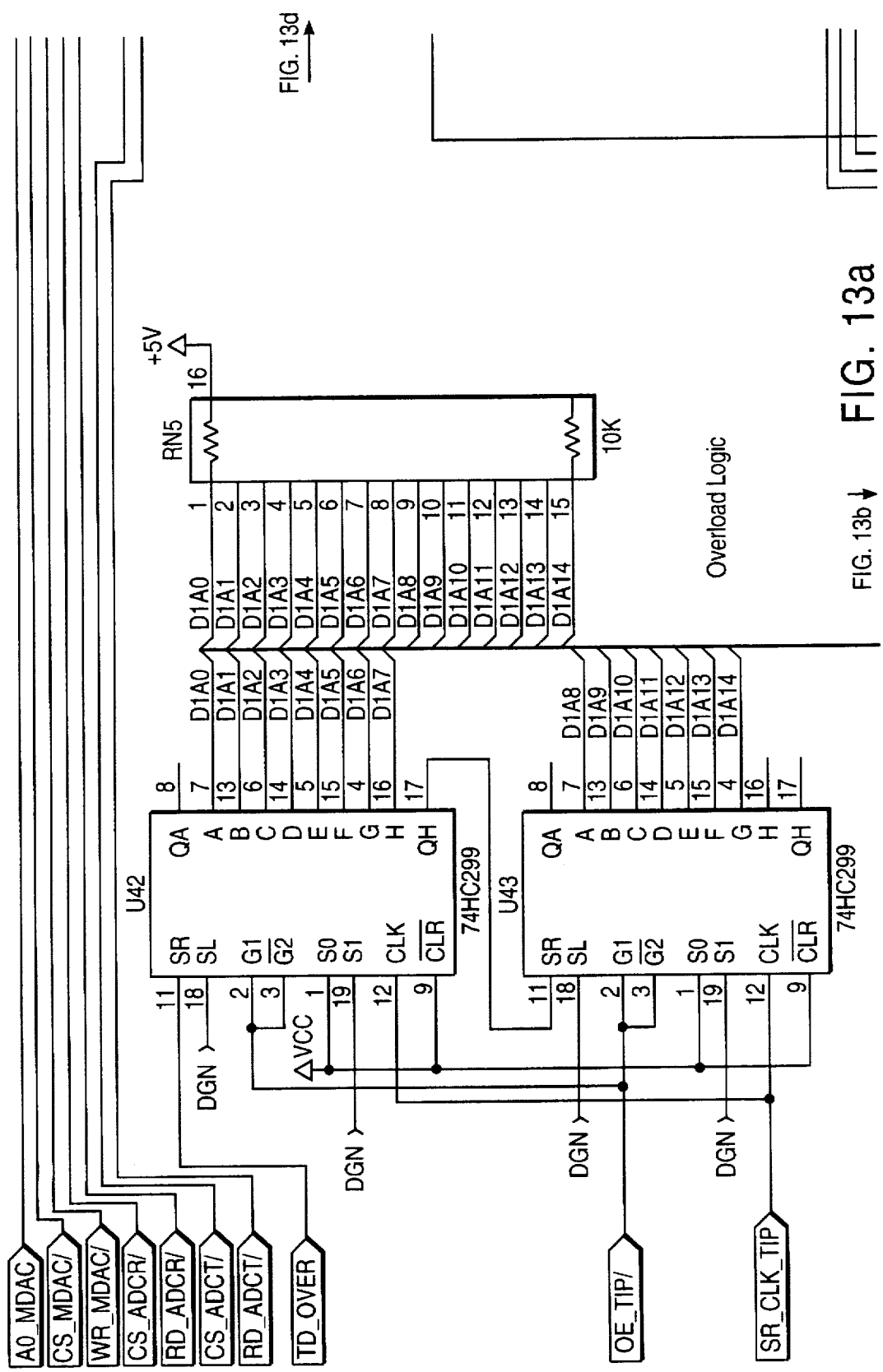

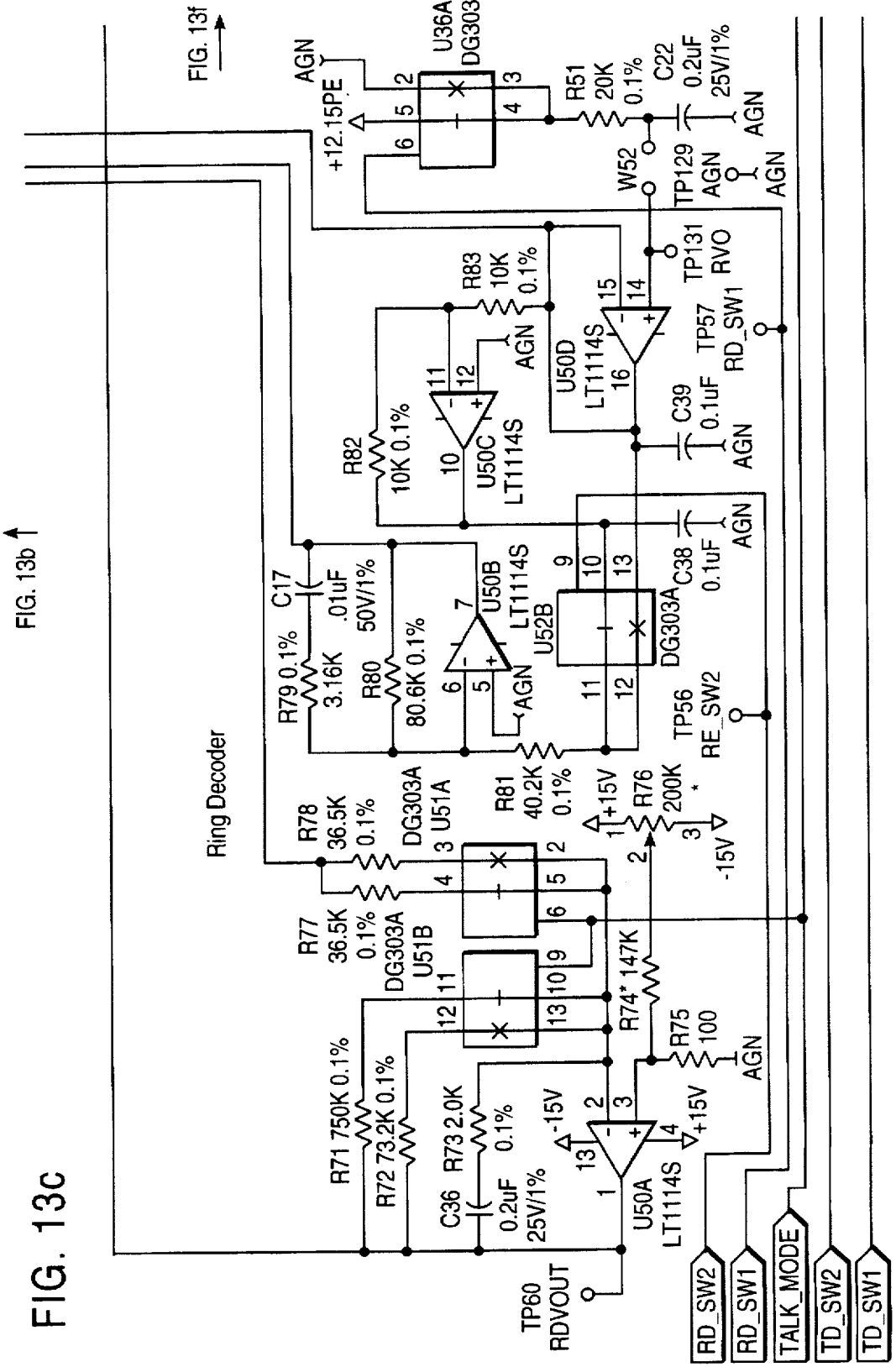

Nonlinear Squaring Function

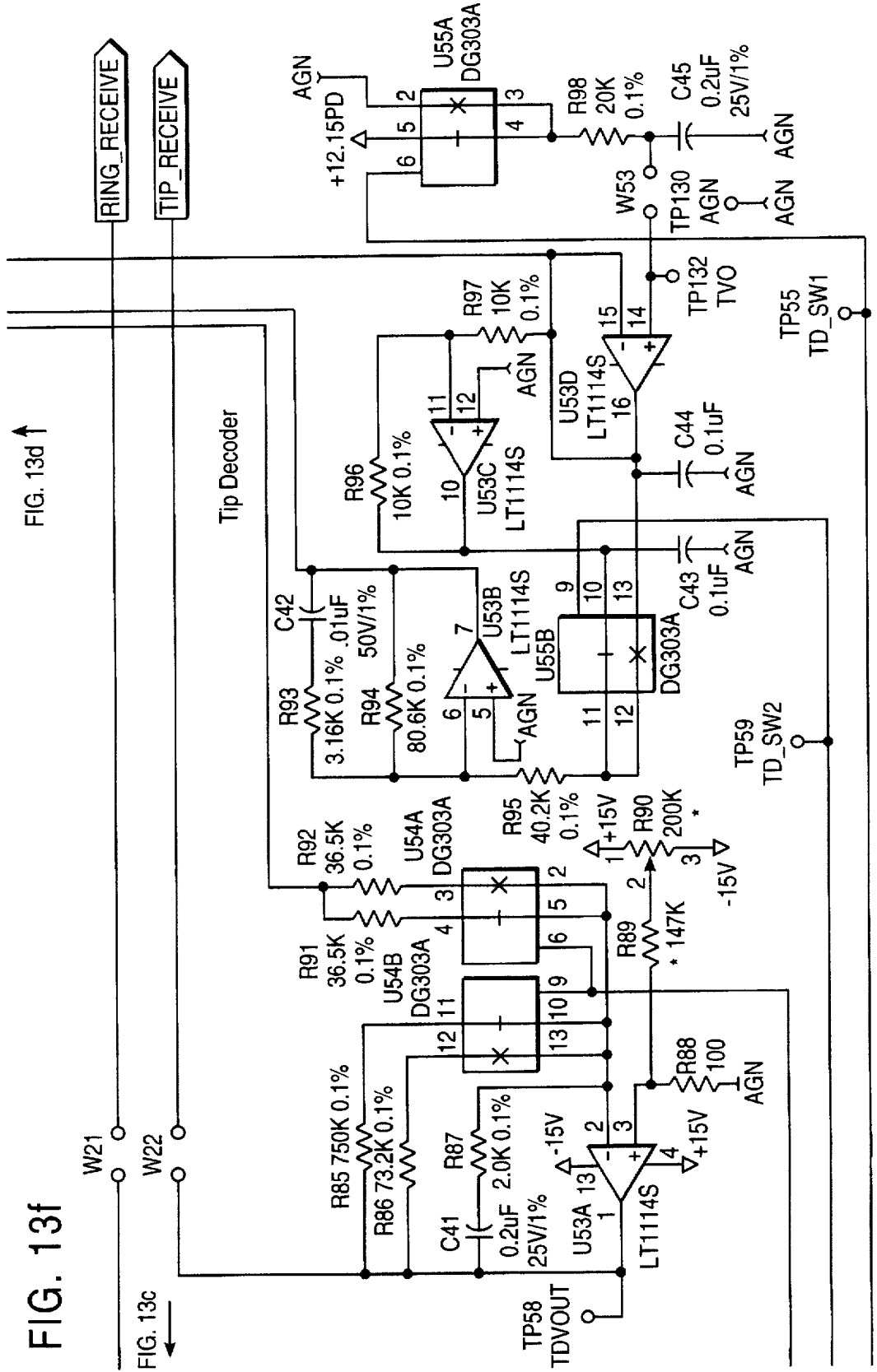

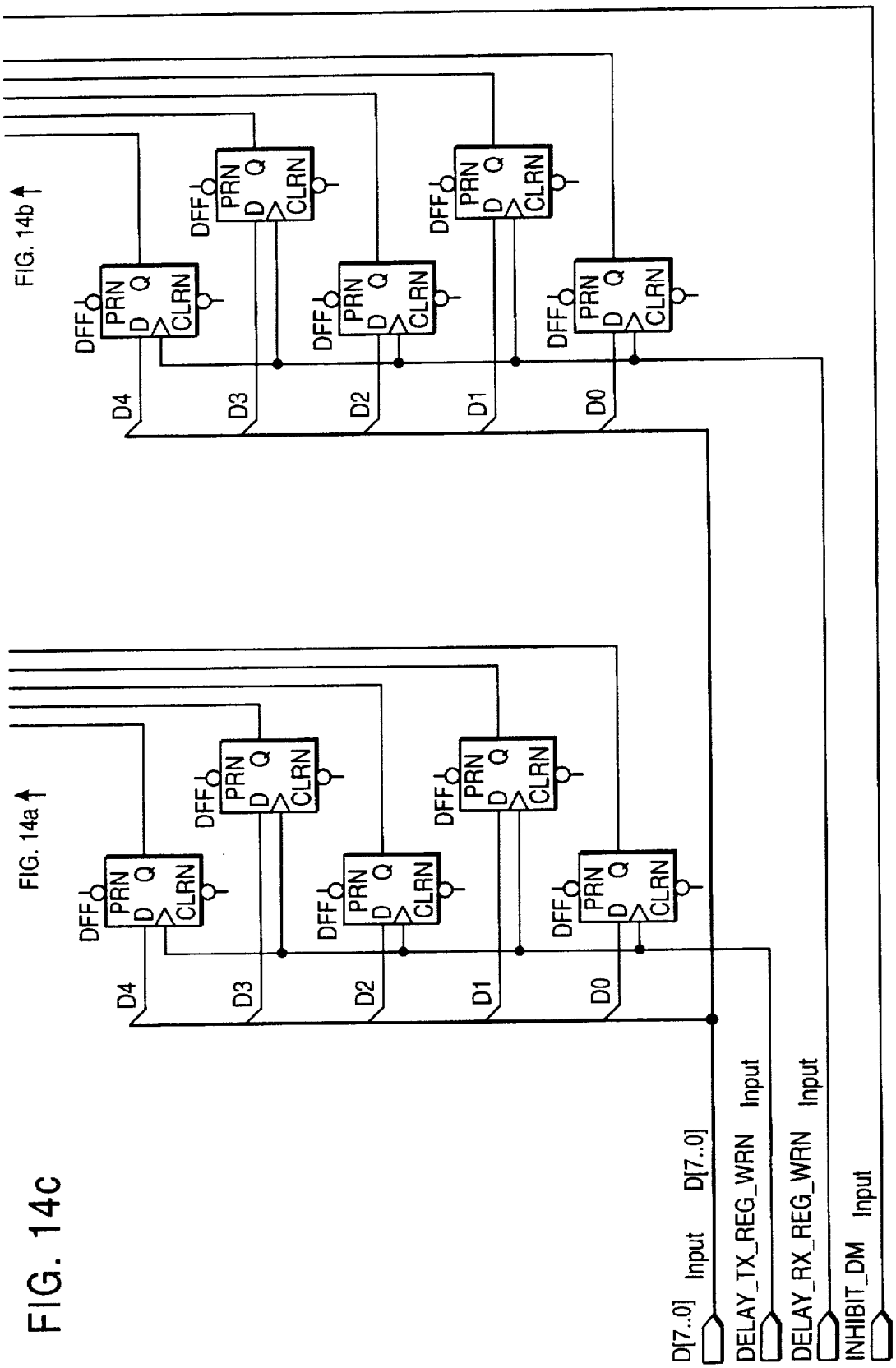

1

DELTA MODULATOR WITH PSEUDO CONSTANT MODULATION LEVEL

BACKGROUND OF THE INVENTION

1. Field of Invention

This invention relates to digital encoding/decoding of analog signals, and particularly to delta modulation

2. Related Art

The transmission of telephony signals is generally done using digital encoding and multiplexing techniques. These techniques generally sample an input analog signal (e.g., a voice signal) and then quantize the value of each sample, that is, assign a numerical value to that sample, usually in binary code. This digitized signal is then transmitted.

The most prevalent of such transmission techniques is Pulse Code Modulation (PCM). Generally, in a PCM system, an 8-bit value is assigned to each sample of the message signal. However, while being suitable for many applications and generally providing a good signal-to-noise (S/N) ratio, PCM techniques require a significant amount of transmission bandwidth. For instance, to encode a 3.5 kHz voice signal using an 8 kHz sampling rate, since every sample taken generates 8 bits, a 64 kbps output bit rate (the transmission bandwidth) will be required. Thus, PCM is unsuitable for use in bandwidth limited applications.

Other techniques (e.g., Adaptive Differential PCM (ADPCM)) have attempted to use encoding methods that approach the performance of standard PCM while using much less bandwidth (ADPCM generally transmits at 32 kbps). However, most of these techniques are complex and typically require several samples to be taken before bits are encoded, thereby introducing a delay (the wait time for all necessary samples) in the transmission of the signal.

Another encoding technique with reduced transmission bandwidth requirements is Delta Modulation (DM). DM uses only one bit to encode samples. Thus the sampling rate and the bit rate (transmission bandwidth) are the same. Further, the current sample is encoded using data only from the current and prior samples, minimizing delays associated with encoding and decoding processes Moreover, DM systems are relatively simple to implement compared with other encoding systems. DM is also well suited for applications requiring a wide dynamic range at lower frequencies.

In operation, rather than transmitting a code for the actual amplitude of the signal sampled, a delta modulator transmits only a 1-bit code for each sample indicating whether the sampled signal is greater than or less than a reconstructed version of the signal based on the previous 1-bit codes: a "1" indicates the sampled signal is greater than the reconstructed signal and a "0" indicates the sampled signal is less than the reconstructed signal. Each increase or decrease is equivalent to a "step up" or a "step down." In this manner, the message signal is encoded as a sequence of "ups" and "downs" in a manner resembling a staircase. An example message signal waveform 105 is shown in FIG. 1 with the DM encoded signal 110 shown as steps overlaying the message waveform. The encoded signal can later be accurately reconstructed and smoothed with a filter.

In FIG. 1, each step is approximately equal in size. Sometimes, however, a delta modulator using a single step size will not be able to keep up with a signal that changes rapidly, e.g., if signal amplitude rises too quickly. In such cases, the delta modulator is said to experience "slope overload." An illustration of slope overload is shown in FIG. 2, in which an input signal waveform 205 is shown with the DM encoded signal 210 overlaying (shown as step 5).

Also shown in FIG. 2 is an example of quantization, or granular noise. Granular noise is the result of the difference in the actual signal and the stepped (or quantized) signal. The difference leads to an uncertainty in the message signal level. The smaller the step size, the lower the quantization noise. However, a small step size increases the likelihood of slope overload. To the contrary, larger step sizes increase the granular noise levels. Both slope overload and granular noise will lead to distortion in the recovered signal with granular noise dominating for slow signals.

To minimize the effects of overload and granular noise, another method, adaptive delta modulation (ADM) is utilized and is similar to delta modulation, except that the step size can be varied. When slope overload conditions are detected, the step size is increased. In non-overload conditions, the step size is decreased. Typically, in one popular method of ADM known as continuously variable slope delta modulation (CVSD), the output bit stream is monitored for the occurrence of an overload condition. If an overload condition exists, a signal is sent to a step size generator, notifying it to increase the step size. If an overload condition is not present, the step size generator will gradually decrease the step size. Eventually the step size decreases to a minimum value or to a point at which overload is detected, causing the step size to increase again.

While the above-described CVSD system generally works, the performance levels of such a system are less than ideal. For instance, the loop gain of the CVSD system increases with increasing step size resulting in non-constant dynamic response, e.g., the system may become hypersensitive to variation in the input signal and respond to slope overload or granular noise conditions too quickly, causing step sizes much larger or smaller than necessary. Step sizes that are too large or too small create the same overload and granular noise problems that varying the step size is intended to combat. Moreover, DC offset voltages, present in many elements used in forming a delta modulator, will cause variations in the step size that will not be constant for both transmitter and receiver and will therefore influence the accuracy of the delta modulator by causing gain errors. DC offsets are particularly a problem for very low signal levels.

Thus, it is desirable to develop an improved delta modulator that creates a more constant gain and achieves an improved S/N ratio over a wider dynamic range of the input signal and improves immunity to gain variation due to offset voltages over that of traditional CVSD.

SUMMARY OF THE INVENTION

The present invention is directed toward delta modulation. A delta modulator in accordance with the invention utilizes a step size controller which includes an overload detector, a step size generator, and an modulation level regulating means. The overload detector monitors the serial bit stream output from the system and then outputs a signal indicative of whether overload conditions are present. The step size generator generates steps of varying sizes which are utilized by the delta modulator to approximate the input message signal. The modulation level regulating means monitors the overload detector output and when the average value of the overload detector output has reached a particular threshold, the modulation level regulating means outputs a signal to the step size generator indicating the step size should increase. In this manner, the modulation level can be optimized causing an improved signal-to-noise ratio over a wider dynamic range compared to conventional delta modulators.

3

The modulation level regulating means can be implemented in either an analog or digital format. The digital implementation, however, is generally preferable as it eliminates errors in signal processing due to component irregularities.

The delta modulator in accordance with the invention further includes a non-linear shaping network, which expands the range of step signals produced by the step size generator to enable more accurate tracking of the signal. The non-linear shaping network is generally comprised of a multiplying-digital-to-analog converter and an analog-to-digital converter, which simplifies system calibration and improves the accuracy and tracking of the encoder and decoder over conventional resistor-diode non-linear shaping networks.

To improve immunity to gain errors caused by offsets present in the non-linear shaping network, the non-linear shaping network is placed downstream of a polarity switch, which is coupled to the step size generator. Such a move minimizes AC signal errors (errors in step size) caused by offsets in the nonlinear shaping network for very small AC signals.

BRIEF DESCRIPTION OF THE DRAWINGS

The present invention is described with respect to particular exemplary embodiments thereof and reference is accordingly made to the drawings in which like numbers denote like parts, and in which.

DETAILED DESCRIPTION

In digital encoding/decoding of analog signals, one of the primary determinations of system performance is signal-to-noise (S/N) ratio. In the delta modulator in accordance with the invention, an improved S/N ratio is achieved as well as a more constant gain over a wider dynamic range of the input signal over that of traditional delta and adaptive delta modulation. Moreover, improved immunity of gain variation to DC offset voltages is achieved which reduces system errors.

Figure 3A:
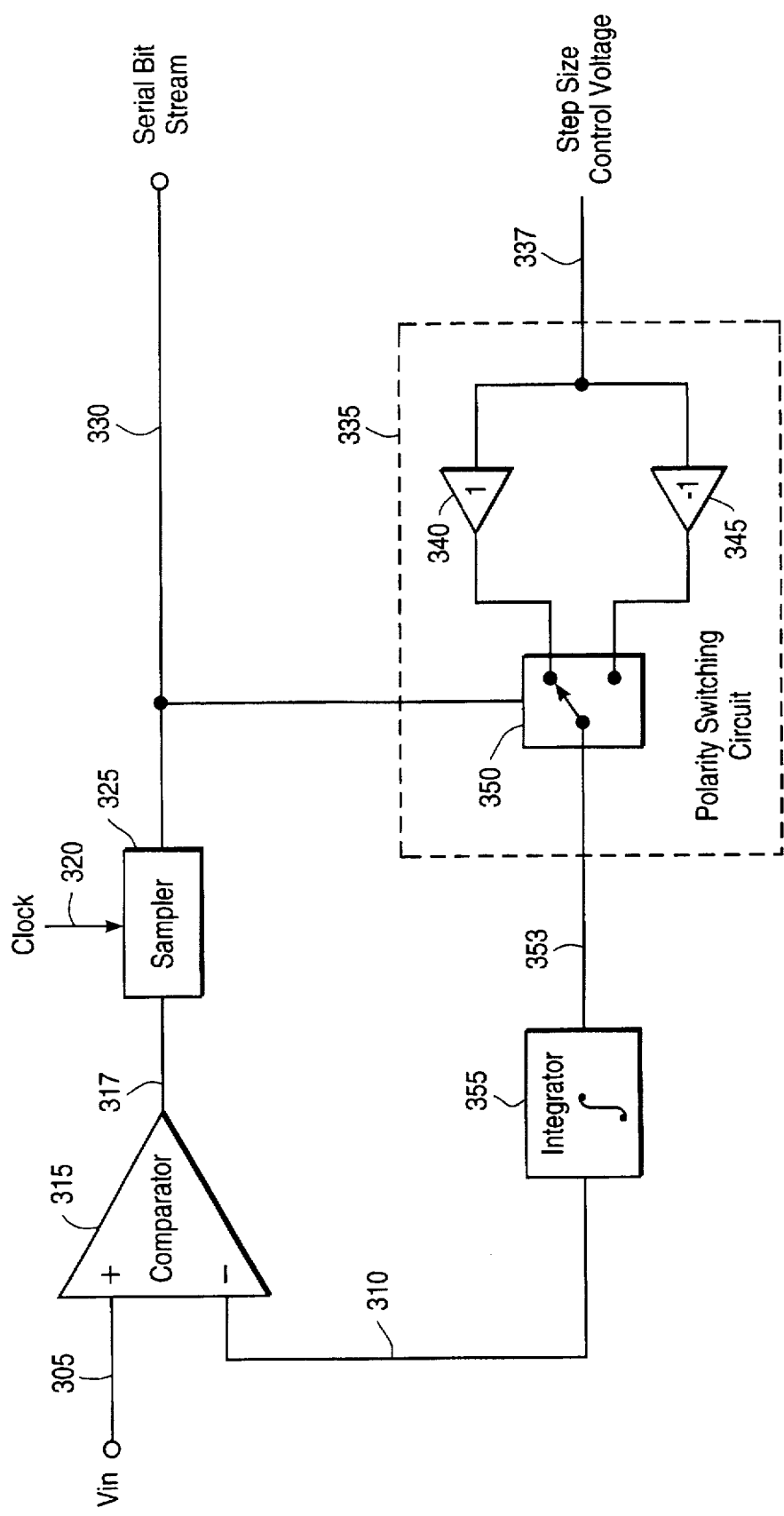
FIG. 3a illustrates a block diagram of the encoding circuitry of a delta modulator with a constant step size.

A basic delta modulator with a uniform, or constant, step size is shown in FIG. 3a. An input signal, $V_{in}$, is coupled via line 305 to the positive input of comparator 315. The negative input of comparator 315 is coupled to a feedback signal on line 310. The output signal on line 317 of comparator 315 indicates whether $V_{in}$ on line 305 is higher or lower than the feedback signal on line 310. Comparator output 317 is then coupled to sampler 325, which is also coupled with clock signal line 320. On each clock pulse, the sampler 325 samples the signal on line 317 and outputs a serial bit stream on line 330 with 1-bits indicating the input signal is increasing and 0-bits indicating the input signal is decreasing. The output serial bit stream on line 330 is the signal to be transmitted to receiving circuitry (discussed further with reference to FIG. 3b).

Signal line 330 is coupled to polarity switching circuit 335. Polarity switching circuit 335 includes a unity gain amplifier 340, an inverting unity gain amplifier 345, and a switch 350. Polarity switching circuit 335 receives a step size control voltage on line 337. Step size control voltage line 337 is coupled to both the unity gain amplifier 340 as well as the inverting unity gain amplifier 345. The output of each amplifier 340 and 345 is coupled to switch 350. When the signal on line 330 takes on a positive or a "1-bit" value, switch 350 allows the signal output from the unity gain amplifier 340 to pass through switch 350 onto line 353. If the signal on line 330 is negative or a "0-bit" value, switch 350 allows the signal output from the inverting unity gain amplifier 345 to pass through switch 350 to line 353. Thus, the control voltage on line 337 is passed to line 353 as a positive or a negative pulse value. Alternatively, polarity switching circuit 335 coupled with the step size control voltage can be any two polarity pulse generator which responds to the values on line 330 by outputting a positive polarity pulse in response to a "1" and a negative polarity pulse, of the same magnitude as the positive pulse, in response to a "0". Line 353 is coupled to integrator 355 which smooths the signal to approximate the input signal, preparing it for meaningful comparison with $V_{in}$ 305 at comparator 315.

Figure 1:
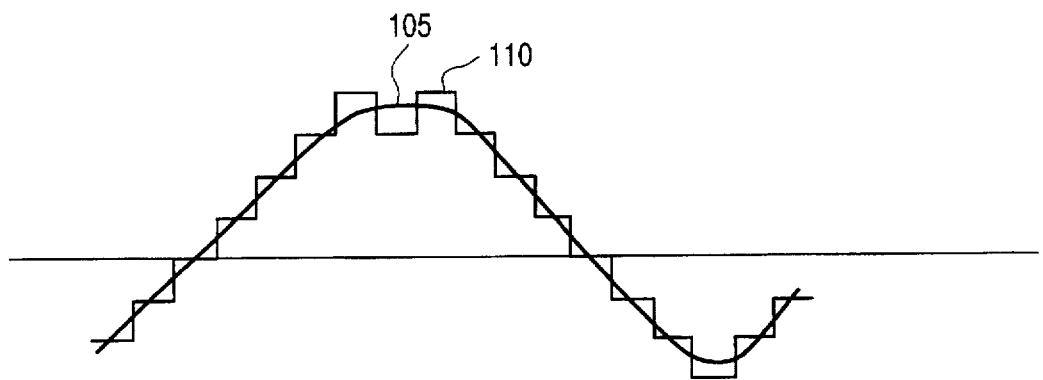
FIG. 1 illustrates an input signal with a delta modulated signal superimposed.
Figure 2:
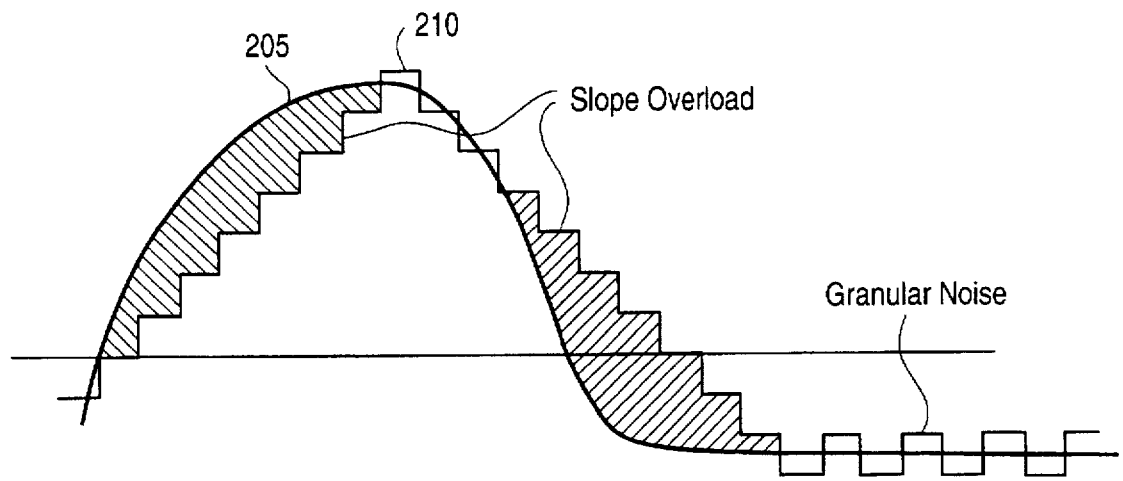
FIG. 2 illustrates an input signal with a delta modulated signal superimposed and illustrates slope overload and granular noise conditions.
Figure 3B:
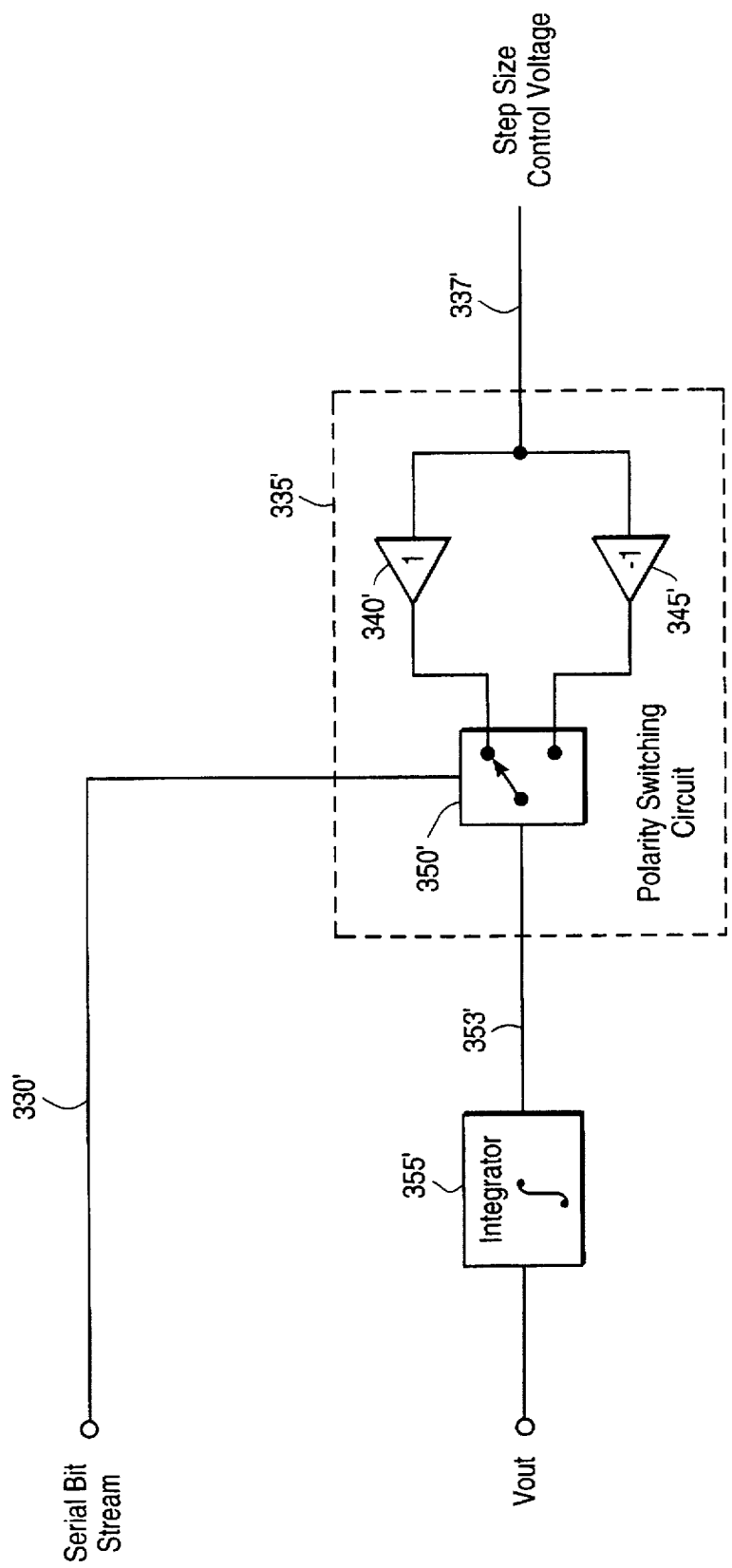
FIG. 3b illustrates a block diagram of the decoding circuitry of a delta modulator with a constant step size.

Upon receiving the digital bit stream, the decoder, or demodulator, shown in FIG. 3b, of the delta modulator system, generates a series of steps up and steps down from the received bit stream and integrates, or smooths, those steps to approximate the originally input message signal. As can be seen in FIG. 3b, the decoder is similar to the encoder in FIG. 3a but lacks the initial comparator and sampler. Ideally, the serial bit stream received by the decoding circuitry will be decoded to approximate the originally received signal $V_{in}$. Yet more likely than not in communication between the circuits of FIGS. 3a and 3b, because input signals vary considerably in characteristics, slope overload in the encoder and granular noise conditions, such as those illustrated in FIG. 2, will occur with the uniform step delta modulator of FIG. 3a, and the original input signal will not be accurately reproduced by the circuit of FIG. 3b.

Figure 4A:
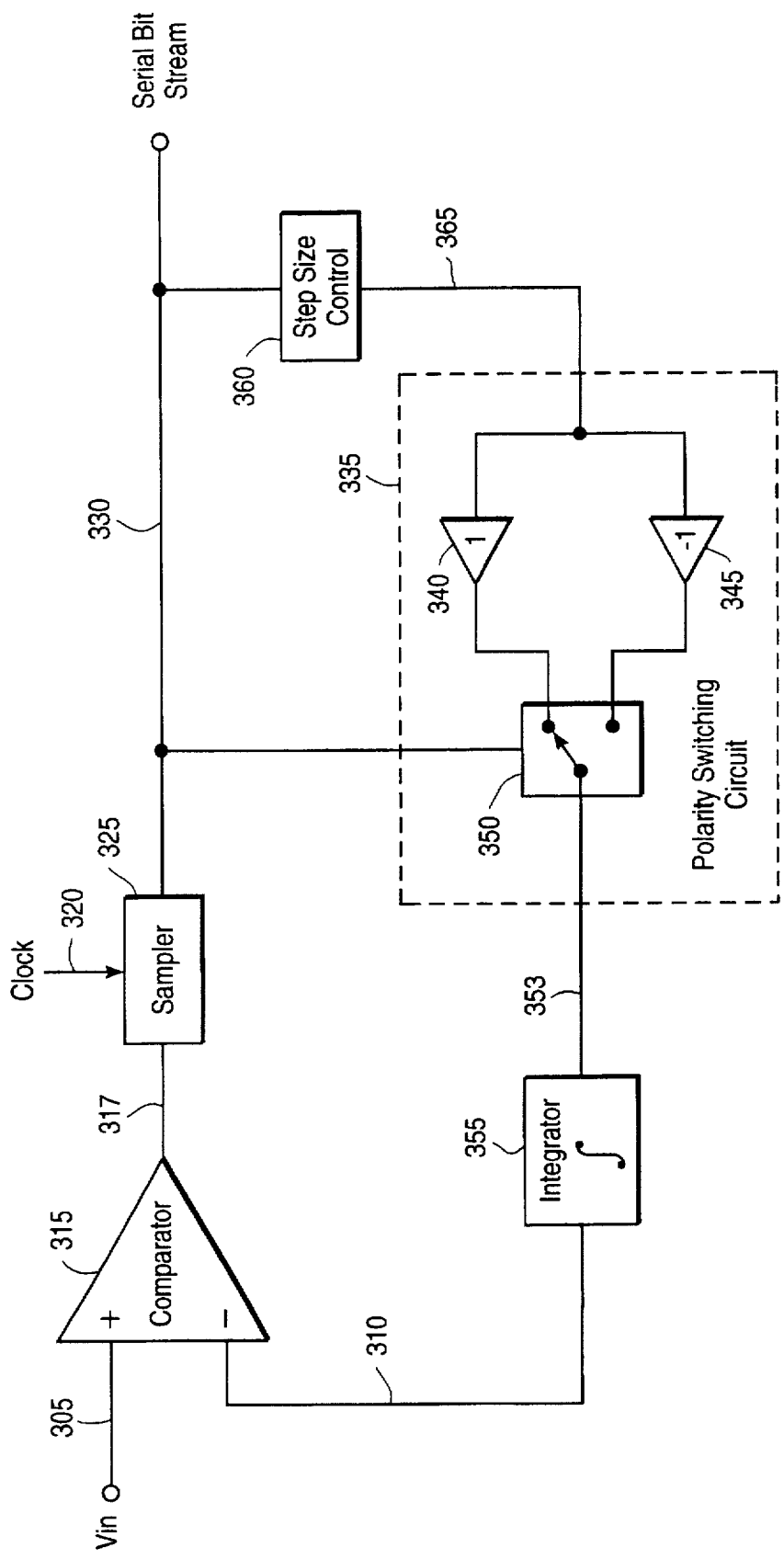
FIG. 4a illustrates a block diagram of the encoding circuitry of a generic adaptive delta modulator.

To aid in minimizing slope overload and granular noise conditions, adaptive delta modulation (ADM) is used, in which the step size is varied. For instance, in a slope overload conditions the step size will increase. FIG. 4a shows a generic block diagram of a delta modulator using a step size controller. FIG. 4a is similar to FIG. 3a except the step size control voltage on line 337 of FIG. 3 is replaced with step size controller 360. Step size controller 360 is coupled to serial bit stream 330 and is also coupled via line 365 to the polarity switching circuit 335.

Basically, in FIG. 4a, step size controller 360 monitors the output bit stream on line 330 and uses an algorithm to adjust the step size based upon the serial bit stream. The new step size is then output on line 365 and fed into polarity switching circuit 335. The operation of polarity switching circuit 335, as well as the rest of the system, is similar to that described with respect to FIG. 3a.

Figure 4B:
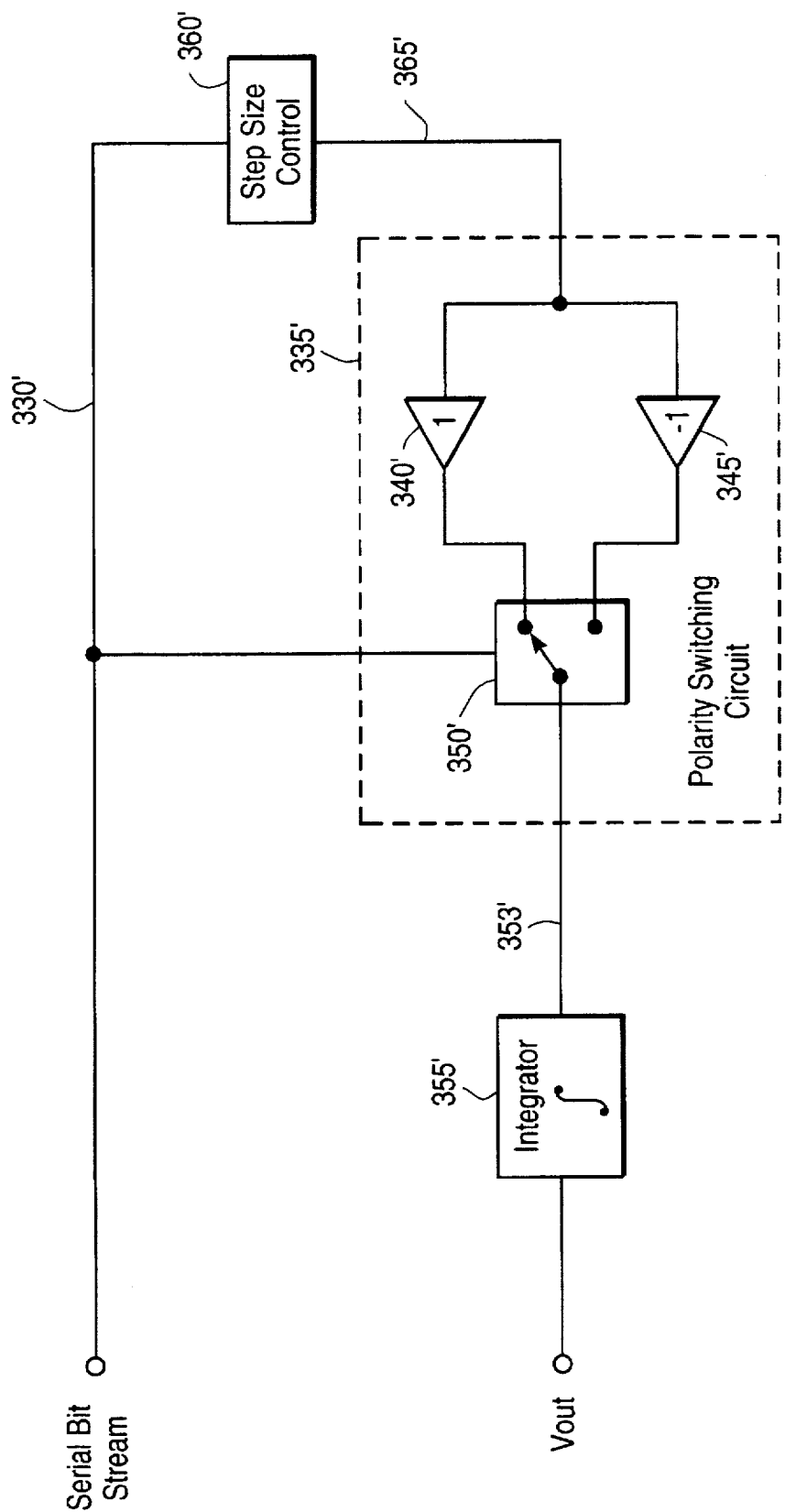
FIG. 4b illustrates a block diagram of the decoding circuitry of a generic adaptive delta modulator.

FIG. 4b illustrates a circuit for receiving the serial bit stream generated by FIG. 4a and for decoding the bit stream to approximate the input message signal $V_{in}$. Note that the receiving circuit of FIG. 4b is identical to that of FIG. 4a except that the initial comparator 315 and sampler 325 of FIG. 4a are not utilized. The decoder of FIG. 4b generates steps of varying sizes in response to the received serial bit stream in the same manner as is done in FIG. 4a. $V_{out}$ of the receiving circuit is thus analogous to the signal on feedback line 310 of FIG. 4a and $V_{out}$ should ideally approximate the original input into the circuit of FIG. 4a, $V_{in}$.

Figure 5:
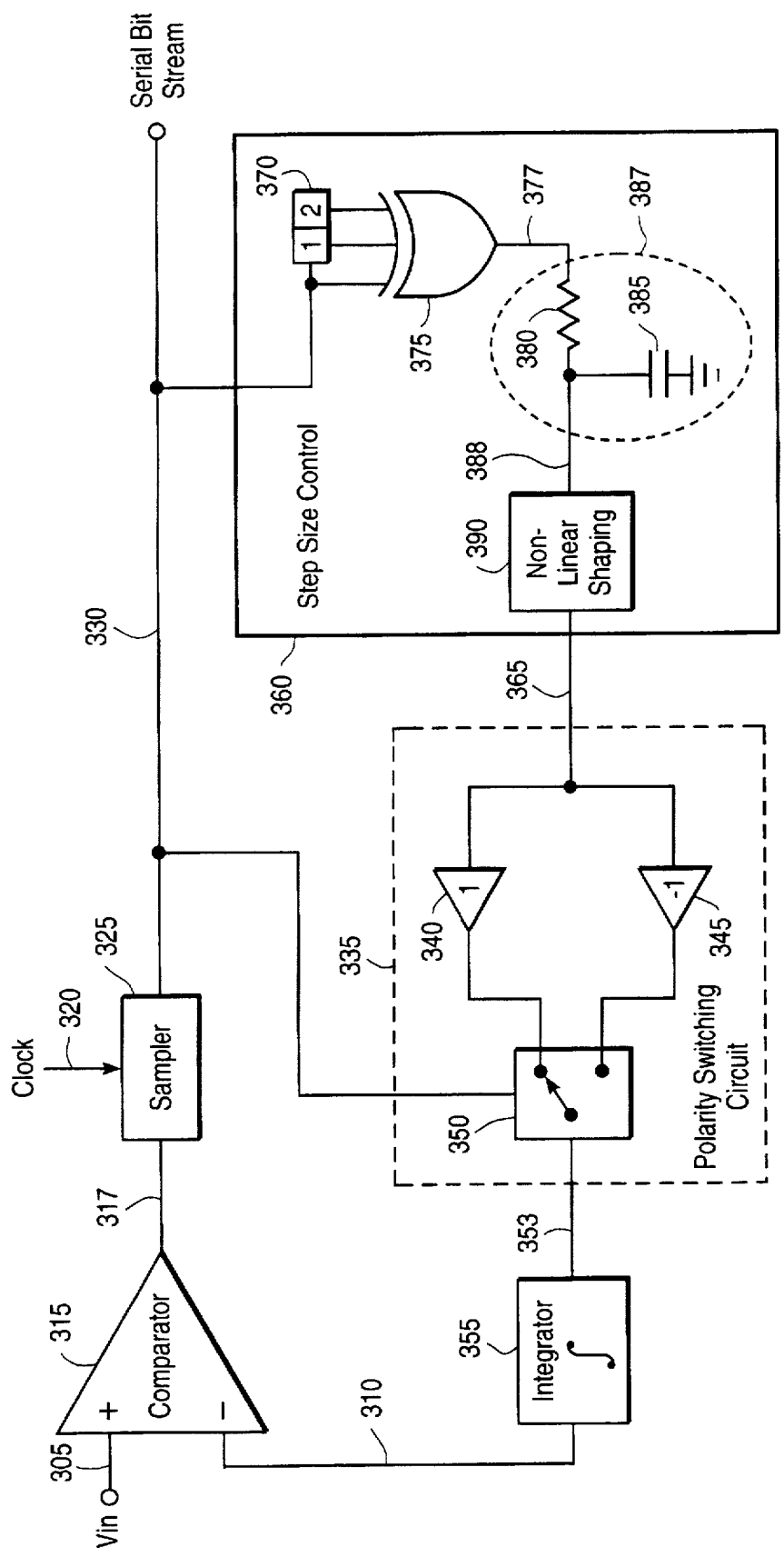
FIG. 5 illustrates a block diagram for a continuously varying slope delta modulator (encoding circuitry)

A specific implementation of the step size controller 360 is shown in FIG. 5 and is generally known as continuously variable slope delta modulation (CVSD). The last three bits output on line 330 are monitored with shift register 370 and exclusive-OR gate 375. If there are three consecutive 1's or 0's, a slope overload situation is indicated, and the output of the exclusive-OR gate will go to a logical high. Other implementations of step size controller 360 may look at greater or fewer bits than three. The output of the exclusive-OR gate is coupled to resistor 380 which is coupled to capacitor 385. Collectively, resistor 380 and capacitor 385 form a "leaky integrator" 387. When the signal on line 377 goes to a logical high, it causes the output 388 of integrator 387 to increase causing the step size to increase. When the signal on line 377 is low, the step size will gradually become smaller due to the exponential decay of charge on capacitor 385.

FIG. 5 also shows non-linear shaping network 390 coupled to line 388, the output of integrator 387. While not essential to step size controller 360, nonlinear shaping network 390 generally improves the dynamic range of the circuit by taking a limited voltage range that the network 390 receives at its input (line 388) and expanding it into a larger range. Such a nonlinear shaping network is often designed to perform an exponential function; that is, the output of non-linear shaping network is approximately its input raised to a power between 1.5 and 2. (See generally, Jayant, BSTJ March 1970, Adaptive Delta Modulation with a One Bit Memory). Traditionally, non-linear shaping network 390 is formed of a resistor-diode network.

Note that FIG. 5 represents only the transmitter/encoder portion of a delta modulation system. A receiving/decoding circuit has not been shown, but would be the same as that illustrated in FIG. 4b with the specific implementation noted in FIG. 5 for the step size controller 360. Hereafter, in discussing delta modulators, and various improvements made thereto in accordance with the present invention, only the transmitting/encoding circuitry will be illustrated. The receiving circuitry is to be understood by those of skill in the art with general reference to FIG. 4b and will not be further illustrated.

Delta modulator operation can be optimized, and thus improve system performance over the CVSD system of FIG. 5, if the modulation level can be kept in a limited range. (See generally, Canniff, Signal Processing in SLC-40 Int'l Conference on Communications, pp. 40–7 through 40–11, 1975). In other words, if the variation of the modulation level can be reduced, a better signal-to-noise ratio will result as well as a more constant gain over a wider dynamic range of the input signal. The modulation level is defined as the average density of n consecutive 1's and 0's (in FIG. 5, n=3), i.e., the duty cycle of the high level (or ones-state) output of the exclusive-OR gate 375.

Figure 6:
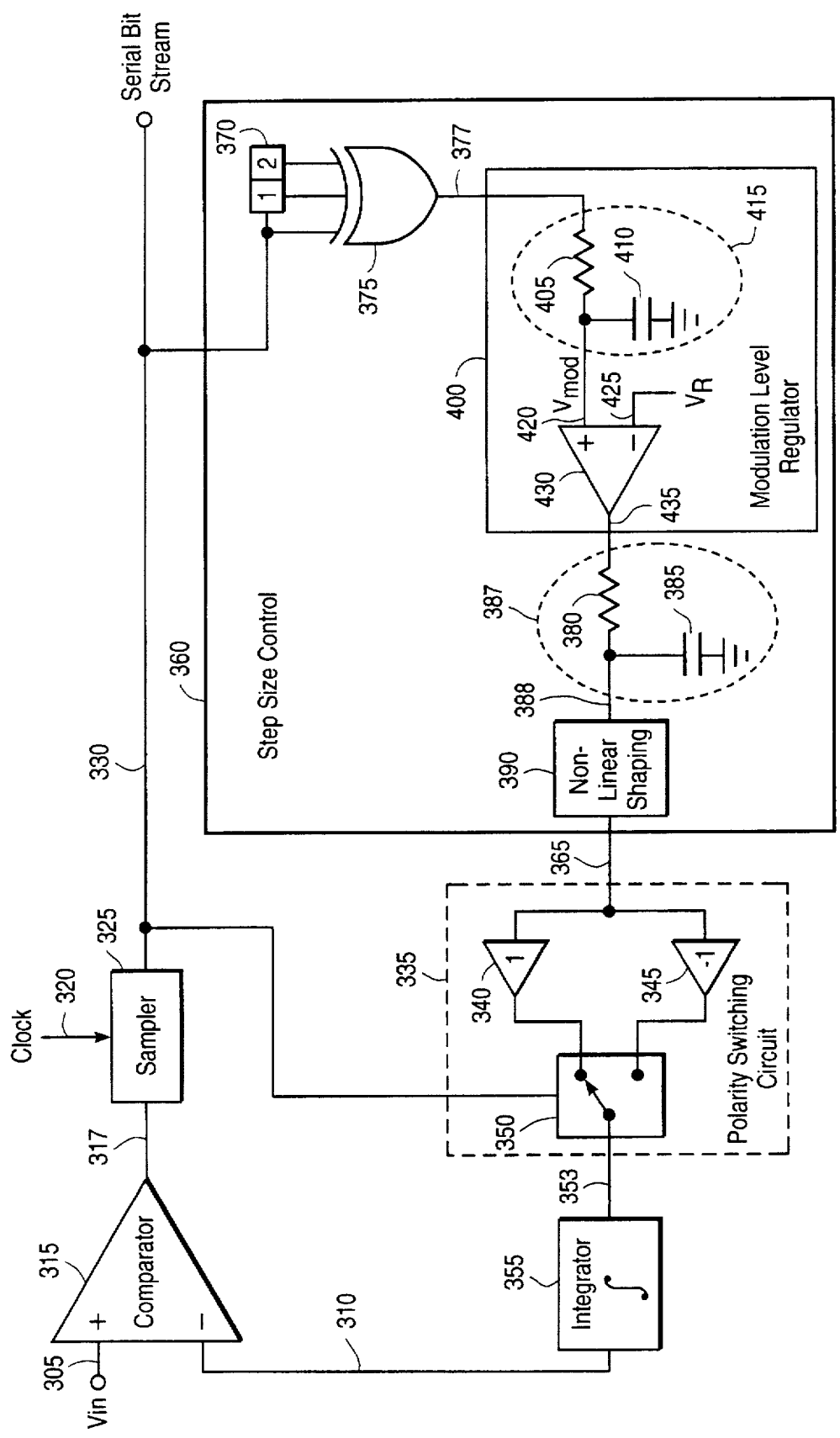
FIG. 6 illustrates a block diagram of one embodiment of a delta modulator in accordance with present invention.

Thus, in accordance with the invention and illustrated in FIG. 6, a modulation level regulator 400 is inserted between the overload detector, which in one embodiment of the invention includes shift register 370 and exclusive-OR gate 375, and leaky integrator 387 which acts as a step size generator. Other step size generating circuitry may also be suitable in other embodiments.

Modulation level regulator 400 optimizes the operation of step size controller 360 by keeping the modulation level output to integrator 387 in a constant optimal range. In the embodiment of the invention, shown in FIG. 6, modulation level regulator 400 includes resistor 405 coupled to exclusive-OR output 377 and capacitor 410 coupled to resistor 405. Together, resistor 405 and capacitor 410 form integrator 415. Other integrator circuitry may also be suitable in other embodiments of the invention. The output 420 of integrator 415 is coupled to the positive input of comparator 430. The negative input of comparator 430 is coupled to a reference voltage signal $V_R$ on line 425. The output 435 of comparator 430 is coupled to integrator 387.

In operation, modulation level regulator 400 shown in FIG. 6 takes the signal on exclusive-OR gate output 377 and integrates it over a short time constant defined by resistor 405 and capacitor 410. The output, $V_{mod}$, on 420 is compared to $V_R$ on line 425. If $V_{mod}$ is greater than $V_R$, comparator 430 outputs a "high" on line 435, thereby causing an increase in the step size. If the output from comparator 430 is a logical low, the step size will gradually decrease. The output 435 from modulation level regulator 400 will thus reflect $V_{mod}$'s fluctuations around $V_R$. The signal on line 435 is integrated to form the step size. There is less variation in the step size voltage for a given dynamic range of input signal than from the traditional scheme shown in FIG. 5. Reduced variation in the modulation level results in an improved S/N ratio and a more constant gain over a wider dynamic range of the input signal.

Figure 7:
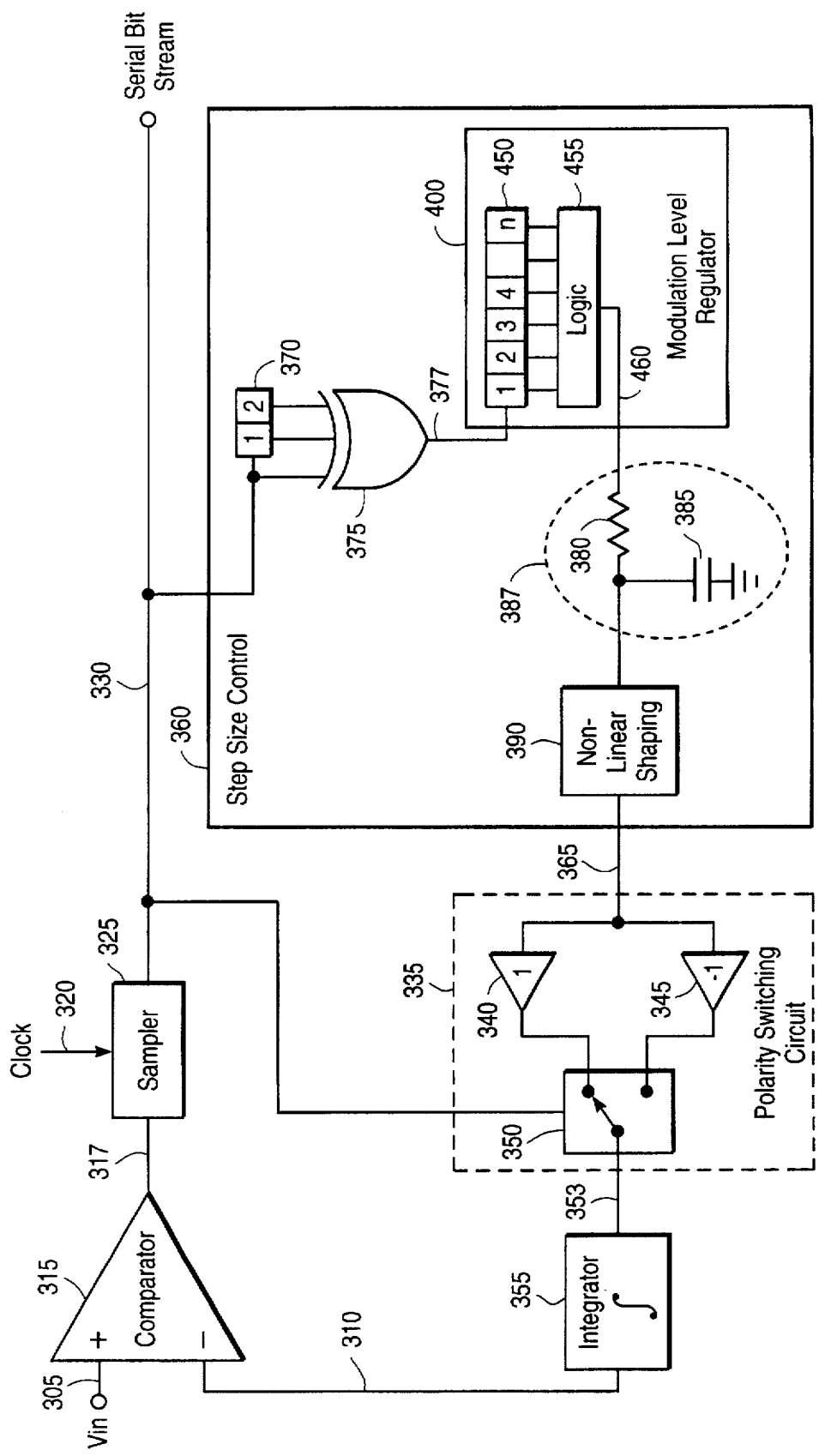
FIG. 7 illustrates a block diagram of a second embodiment of a delta modulator in accordance with the present invention.

FIG. 6 shows an analog implementation of one embodiment of the invention However, analog components can often vary slightly from their stated values and are difficult to match. Even a 1% difference in a stated component value can cause significant errors in a decoded signal. Thus, FIG. 7 shows a digital implementation of one embodiment of the invention. In FIG. 7, modulation level regulator 400 includes shift register 450 coupled to the output 377 of exclusive-OR gate 375. Coupled to shift register 450 is density logic 455 which is used to calculate the number of 1-bits in shift register 450 and output a "high" signal on line 460 when the number of 1-bits has reached a certain value. In one embodiment, density logic 455 is implemented using a programmable read only memory (PROM), which is programmed using the "C" code shown in Table 1below.

TABLE 1

```
/**********************************************************/
short scan(unsigned int value, short criteria)
{
    short i,count;
    unsigned int mask;
    count = 0;
    mask = 0x0001;
    for (i = 0; i < 12; i++)
    {
        if (value & mask) count ++;
        mask <<= 1;
    }
    return (count >= criteria);
}
/**********************************************************/
int main (int argc, char * argv [])
{
    FILE *outf;
    BIT_FILE *outfile;
    unsigned int iter,max_iter,linecount,j;
    outf = fopen("pigrom4.asc","wt");
    if (outfile = OpenOutputBitFile ("pigrom4.dat"))
    {
        max_inter = 0x7fff;
        for (iter = 0; iter <= max_iter; iter++)
        {
            if (scan(iter,5))
            {
                fprintf(outf,"0xFF\n");
                for (j = 0; j < 8; j++)
                    OutputBit(outfile,1);
            }
            else
            {
                fprintf(outf,"0x00\n");
                for (j = 0; j < 8; j++)
                    OutputBit(outfile,0);
            }
        }
        CloseOutputBitFile(outfile);
    }
    else
        printf ("Can not open output file - %s\n", argv[2]);
    fclose(outf);
}
```

Various other implementations of density logic 455 will be known to those of skill in the art.

Output 460 of density logic 455 is coupled to integrator 387 which acts as a step size generator. Other step size generating circuitry may also be suitable.

In operation of the embodiment of FIG. 7, the output 377 of overload detector circuitry, which in the shown embodiment includes shift register 370 and exclusive-OR gate 375, is clocked into shift register 450 which is n bits long. In one embodiment of the invention n=12, i.e., the shift register is 12 bits long. Density logic 455 will produce a logical "1" if there are at least m bits in the shift register equal to a logical "1". In one embodiment of the invention, m is equal to 5. In an example, if shift register 450 is 12 bits long, and it is desired to achieve approximately a 40% 1's density, then if any 5 bits, or more, in shift register 450 are "1's", density logic 455 will output a logical high to integrator 387, causing the step size to increase. If there are four or less 1-bits in shift register 450, a low will be output from density logic 455, causing the step size to gradually decrease.

In this manner, the embodiment shown in FIG. 7 is similar to the embodiment of the invention shown in FIG. 6 except the number of analog components in the modulation level regulator has been minimized. The length of the shift register, n, is analogous to the averaging time constant of integrator 415 (FIG. 6) in an analog embodiment of the invention. The ones density value, m, is analogous to modulation index $V_R$ 425 (FIG. 6) of an analog embodiment of the invention. Use of digital components causes the step sizes generated at the output 460 of modulation level regulator 400 in each of the encoder and the decoder to be closely equivalent, and the result will be minimized tracking error.

Figure 8:
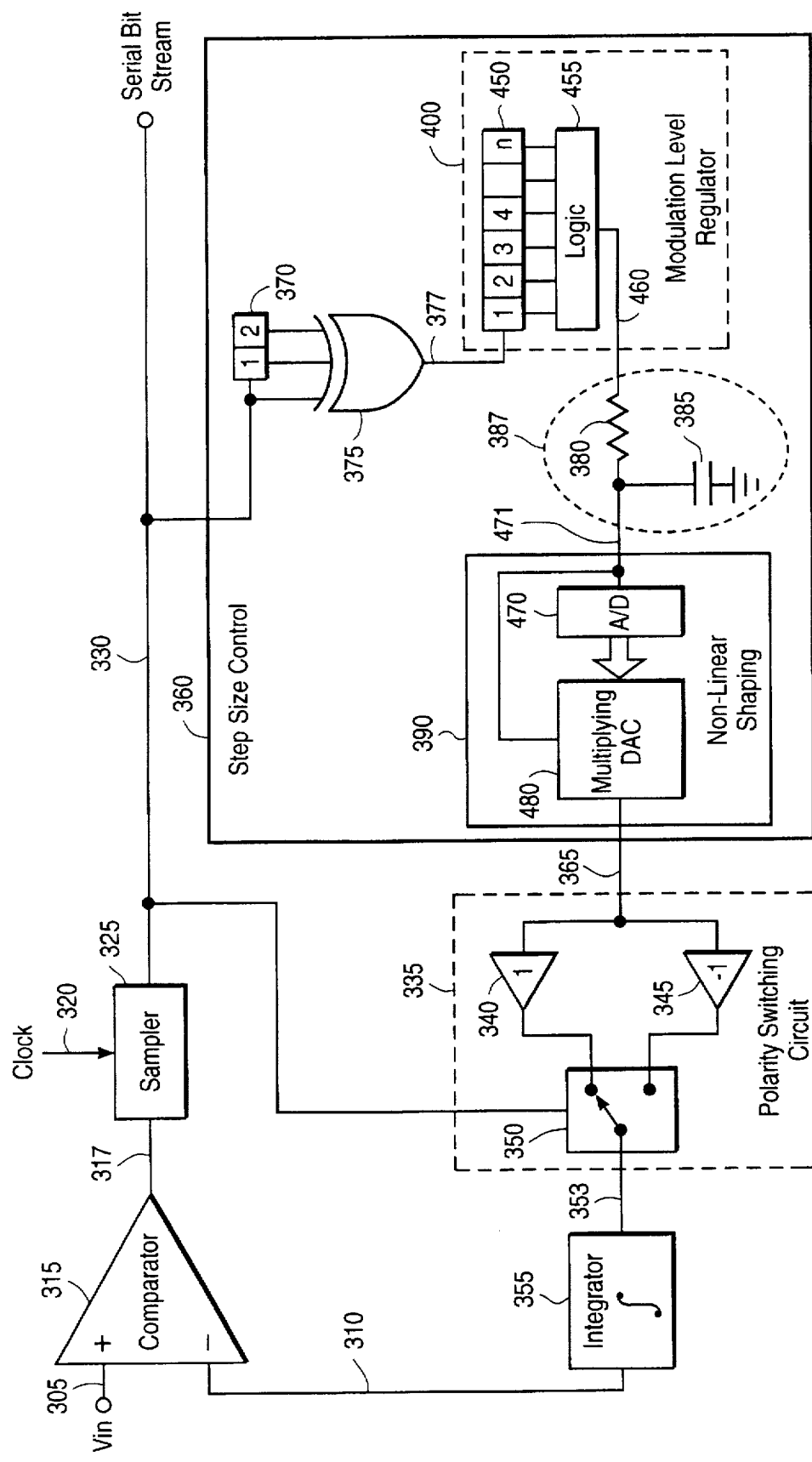
FIG. 8 illustrates a block diagram of a third embodiment of a delta modulator in accordance with the present invention.

Non-linear shaping network 390 further modifies the step size output from integrator 387 by expanding the step size with an exponential function to aid in tracking the step size. Traditionally, non-linear shaping networks 390 are formed of resistor-diode networks which can become very complex and burdensome. To simplify calibration and to improve tracking of non-linear shaping network structure, an analog-to-digital (A/D) converter 470 and a multiplying digital-to-analog converter (MDAC) are utilized as shown in FIG. 8. Conventionally, MDACs have been used only as variable gain amplifiers and have not generally been used to approximate a second order non-linearity.

In FIG. 8, output of the integrator 387 is coupled to A/D converter 470 as well as to MDAC 480. A/D converter 470 is also coupled to MDAC 480. The non-linear shaping network shown in FIG. 8 can also benefit circuits that do not utilize the modulation level regulators shown and discussed with respect to FIGS. 6 and 7.

Figure 9A:
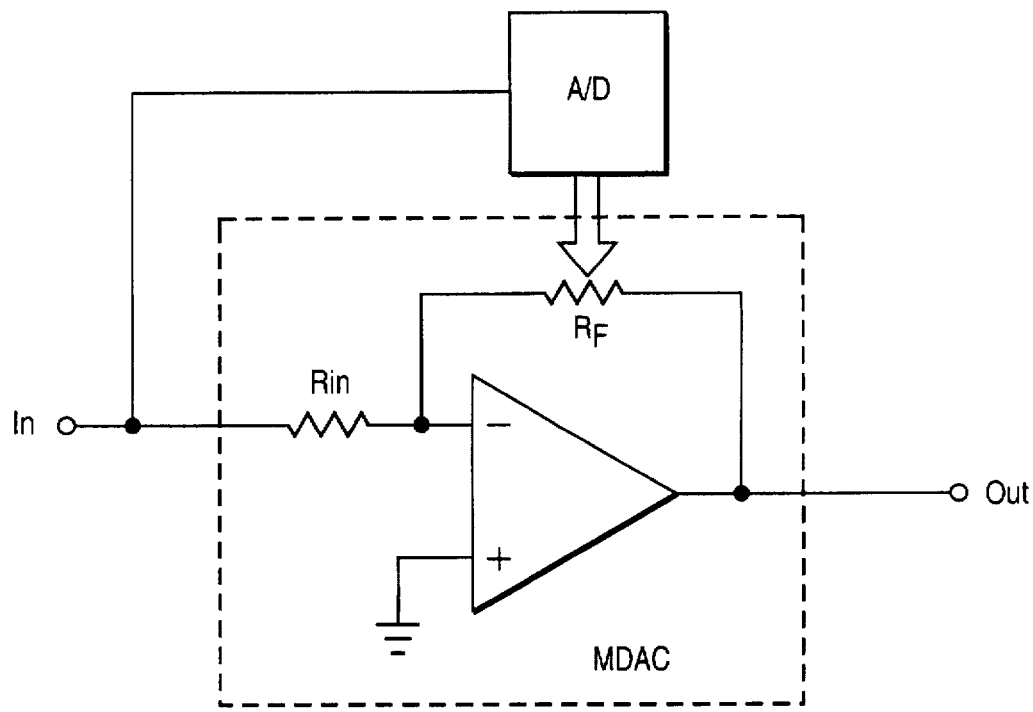
FIG. 9a illustrates a representational block diagram of a non-linear shaping network used in the embodiment illustrated in FIG. 8.

At a basic level, an MDAC is an amplifier with a programmable gain as shown in FIG. 9a. The output of the MDAC is approximately the gain $(-R_F/R_{in})$ times the input of the MDAC, making the gain of the MDAC proportional to its input. As shown, the gain of the MDAC is set by the output of the A/D converter by setting the value of $R_F$, which is the digital quantization of the input. Thus, the MDAC output is proportional to the input squared and the non-linear function approximates a squaring function.

Figure 9B:
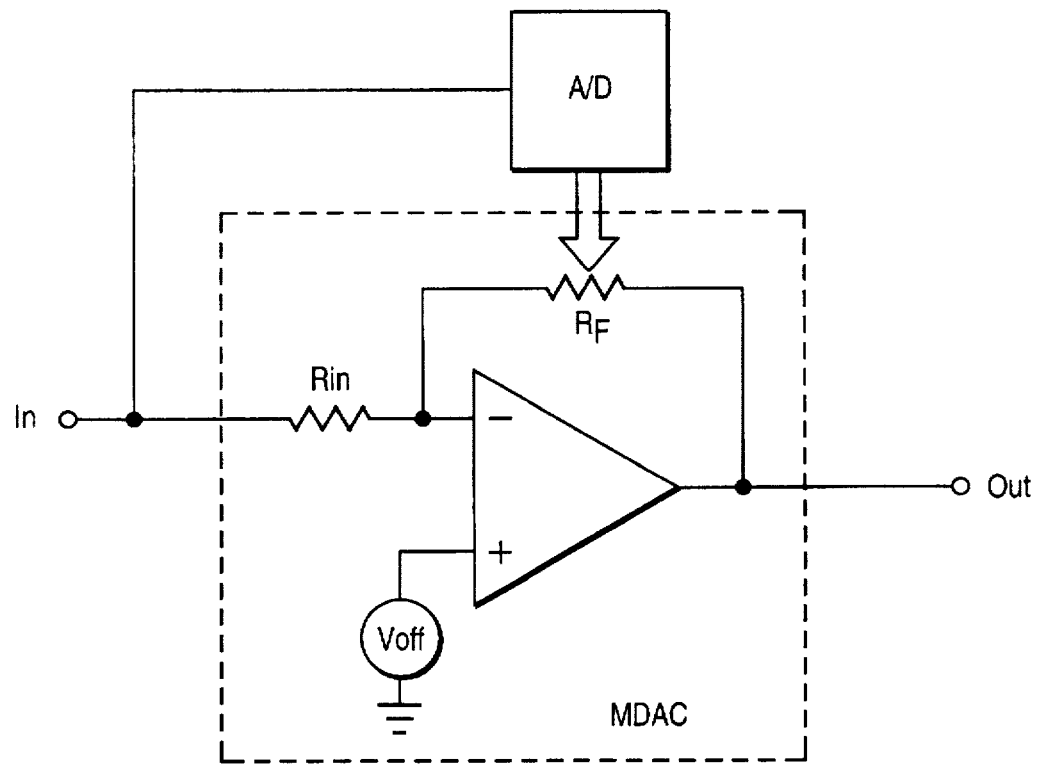
FIG. 9b illustrates a representational block diagram of a non-linear shaping network used in the embodiment of FIG. 8 and having offset voltages.

One problem experienced with non-linear shaping networks however, is that such networks often have variation in components and/or offset voltages. For instance, amplifiers tend to have offset voltages. While an ideal op-amp has an output of $$\frac{-R_F}{R_{in}} V_{in},$$

a realistic op-amp, represented in FIG. 9b, has an output of $$\frac{-R_F}{R_{in}} V_{in} + \frac{R_F}{R_{in}} V_{off}$$

Such variations occurring in an MDAC used in a non-linear shaping network and placed in the signal path before the polarity switching circuit, as in FIG. 8, will cause a gain error for small signals. In other words, a DC offset in MDAC 480 will cause an unwarranted increase or decrease in the expanded step size, resulting in gain errors Thus, even though use of a digital implementation for modulation level regulator 400 as shown in FIG. 8 will reduce errors caused by component variances, non-linear shaping network 390 can introduce other variances, causing significant errors. Errors as a result of offset variances are particularly noticeable if there is a low level signal ($V_{in}$) at input 305 and when the signal level at the input 365 (FIG. 8) of the polarity switch 335 is also low: any offsets or variation will cause a large gain error.

By moving non-linear shaping network 390 to a position following polarity switching circuit 335, better accuracy can be obtained. Any offset in nonlinear shaping network 390 that occurs following the polarity switching network, will result only in a DC shift of the step signal, and does not change the step size or result in a gain error. The benefits obtained from moving the non-linear shaping network will apply whether an MDAC circuit, as shown in FIGS. 8 and 10, is used or not.

Figure 10:
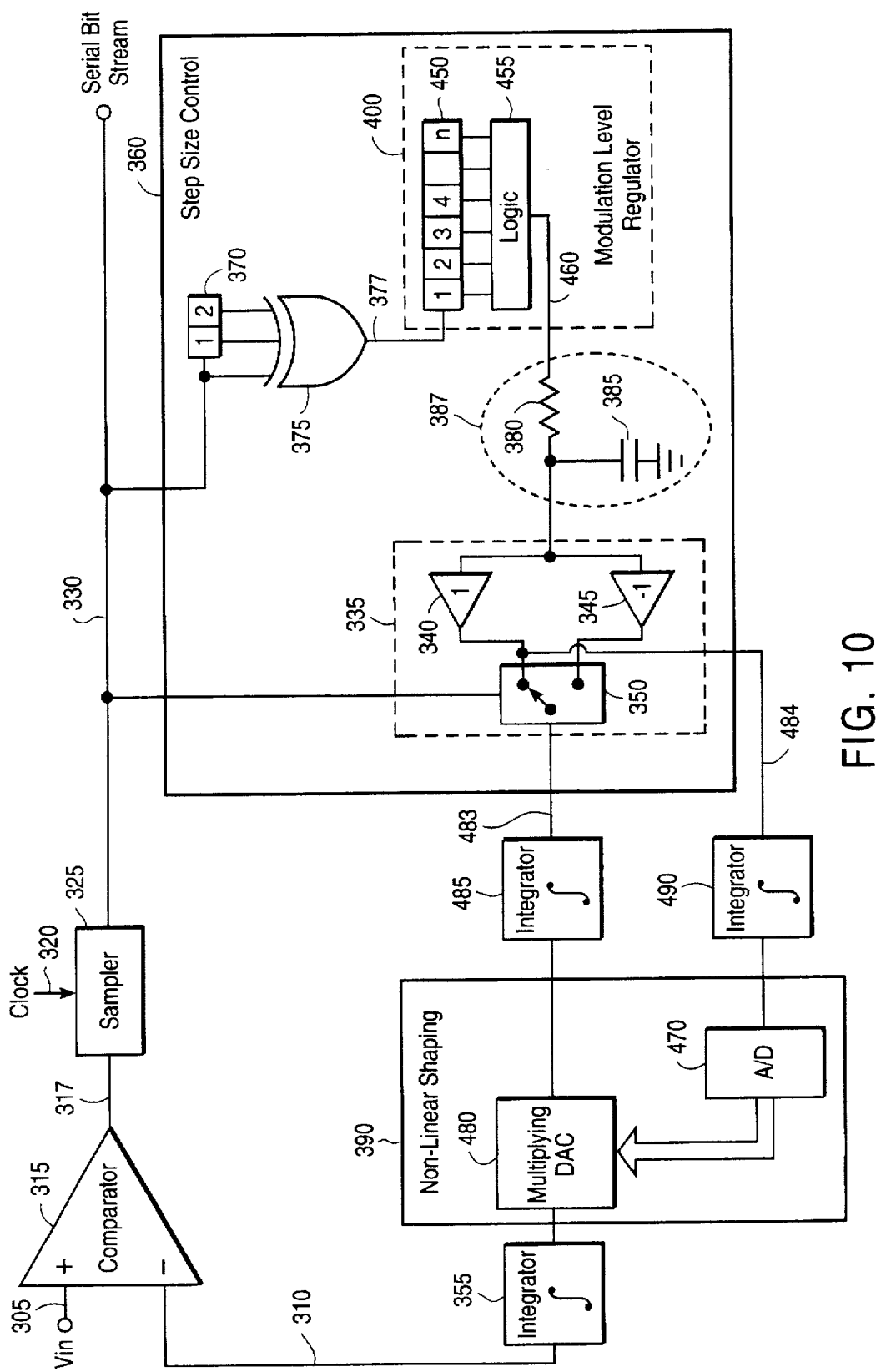
FIG. 10 illustrates a block diagram of a fourth embodiment of a delta modulator in accordance with the present invention.

As shown in FIG. 10, non-linear shaping network 390 is coupled to outputs from polarity switching circuit 335. Specifically, bipolar output 483 from polarity switch 350 is coupled to integrator 485 which in turn is coupled to MDAC 480. A unipolar output 484 from polarity switching circuit 335 is coupled to integrator 490. Integrator 490 is coupled to A/D converter 470 which in turn is coupled to MDAC 480. The output of MDAC 480 is coupled to integrator 355.

Integrators 485 and 490 can be, in their simplest forms, RC low pass filters. However, other integrators, such as active integrators utilizing amplifiers, are also suitable and are known to those with skill in the art. Furthermore, integrators 485 and 490 are optional, used only to create signals which have frequencies that can be handled more easily in the non-linear shaping network 390, and may be eliminated in some embodiments of the invention.

The non-linear shaping network 390 shown in FIG. 10 and placed in the signal path after polarity switching circuit 335, causes a reduction of dynamic range of the signal at the input to polarity switch 335, i.e., the minimum level of signal applied at this point is significantly larger, and thereby improves immunity of the gain variation to offset voltages present in the circuits preceding the polarity switch, such as the polarity switch amplifiers 340 and 345. Non-linear shaping network placed subsequent to a polarity switch will also improve the performance of delta modulators that do not implement the step size control circuitry shown in FIG. 10 or that do not implement the non-linear shaping network circuitry shown (e.g., a traditional resistor-diode network may be utilized and benefits can still be obtained).

Figure 11:
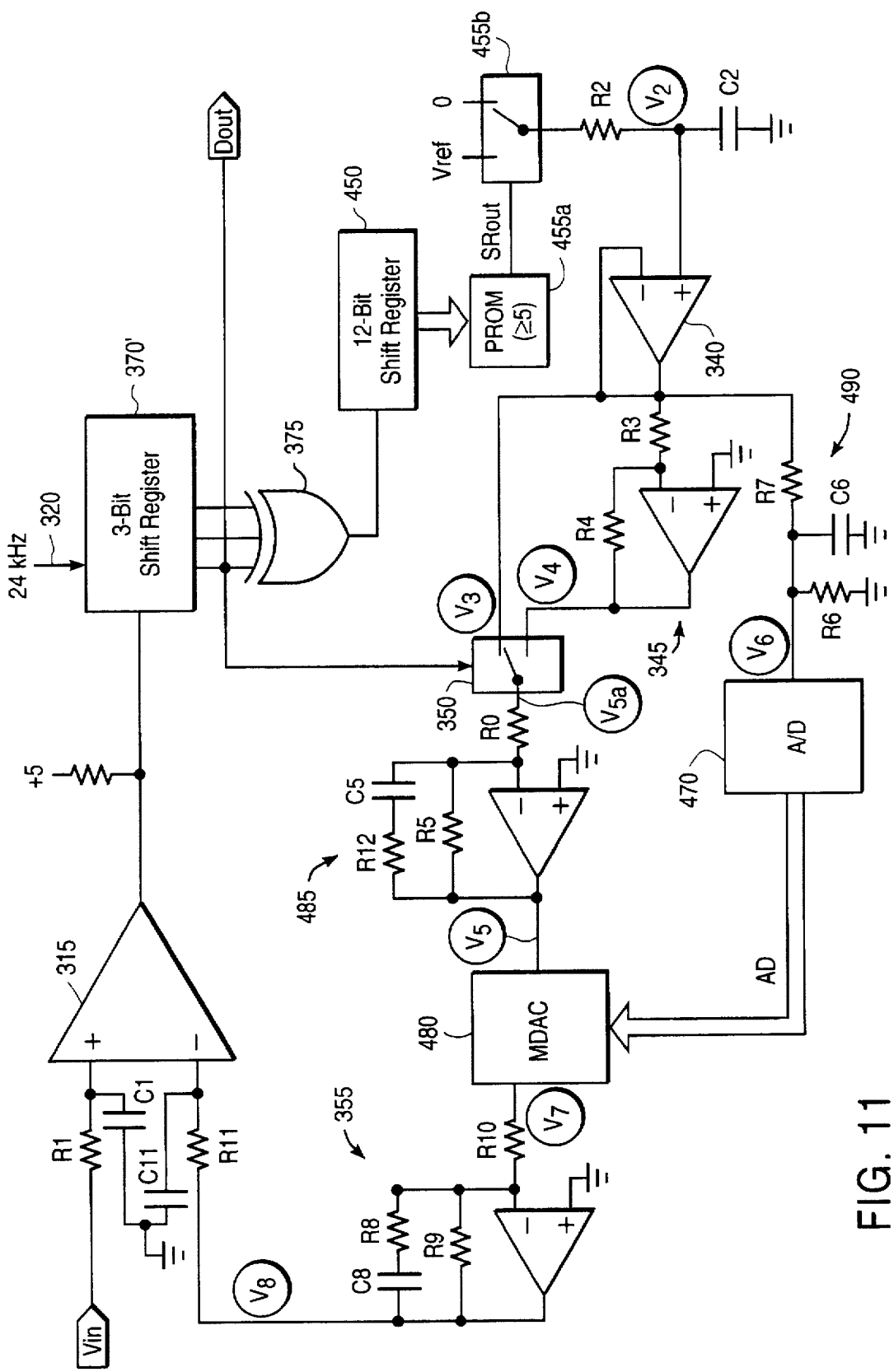
FIG. 11 illustrates a circuit diagram of another embodiment of a delta modulator in accordance with the present invention.
Figure 12B:
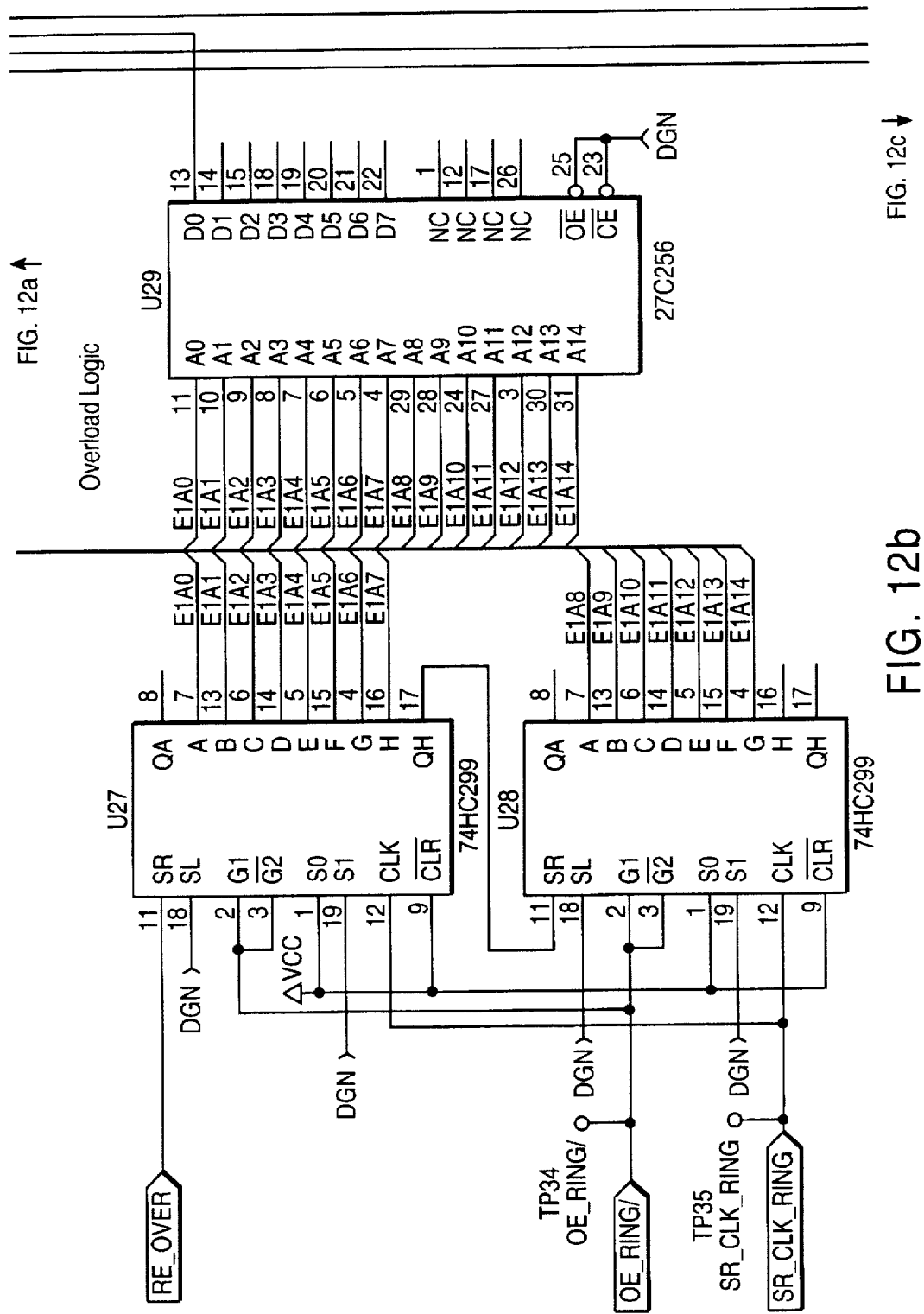
FIGS. 12–16 illustrate detailed schematic drawings of another embodiment of a delta modulator in accordance with the present invention.
Figure 12C:
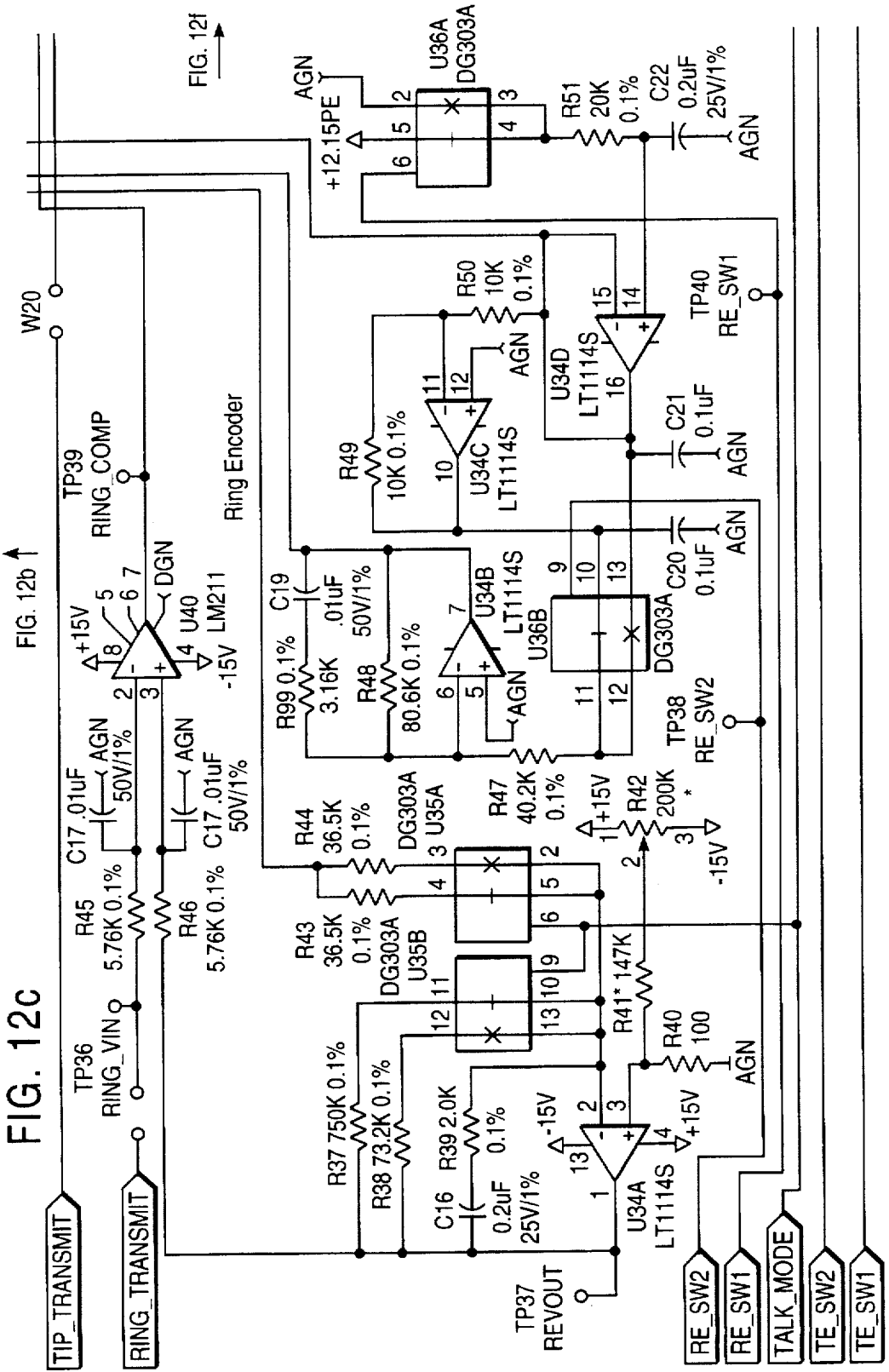
Figure 12D:
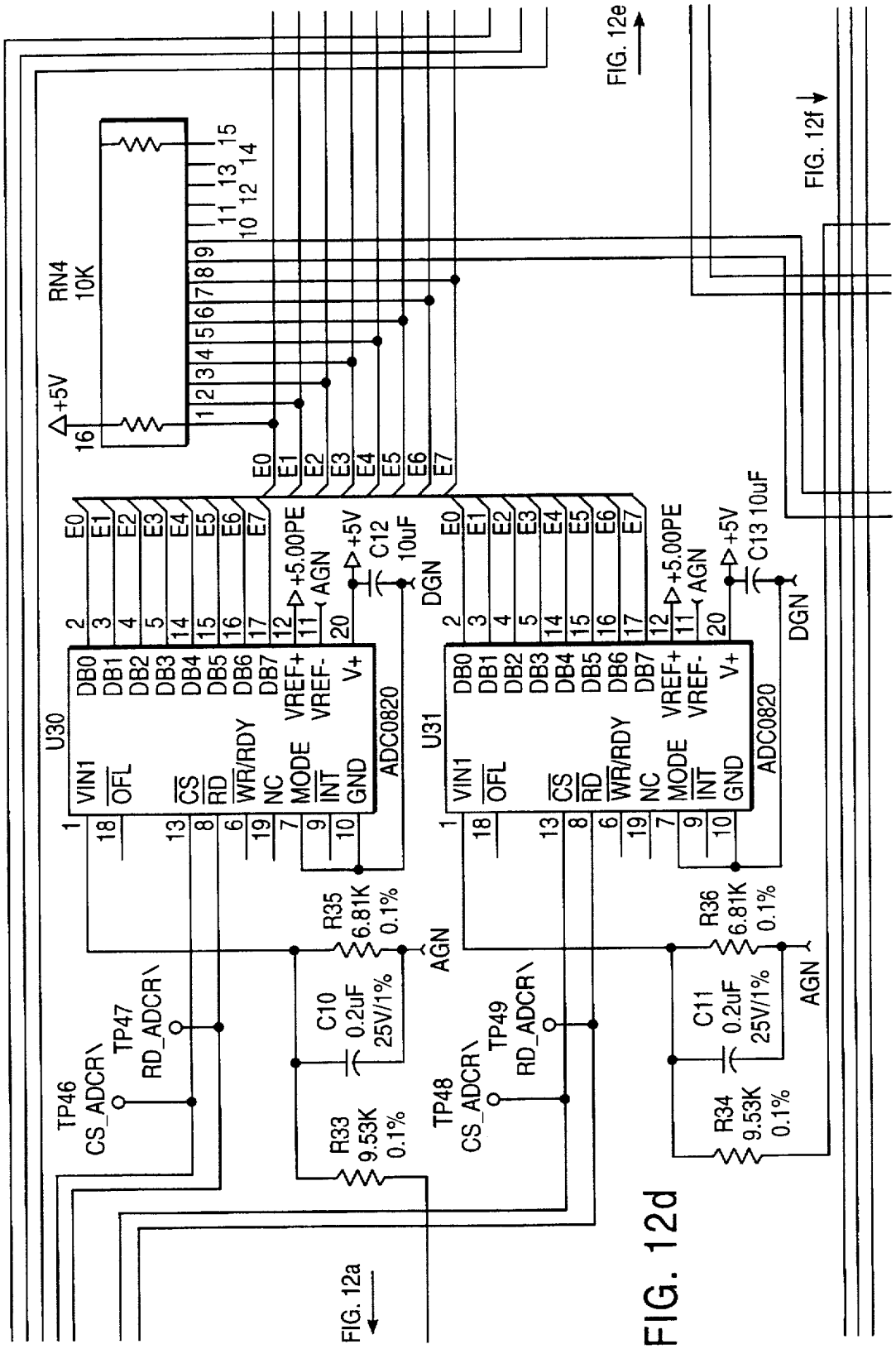
Figure 12E:
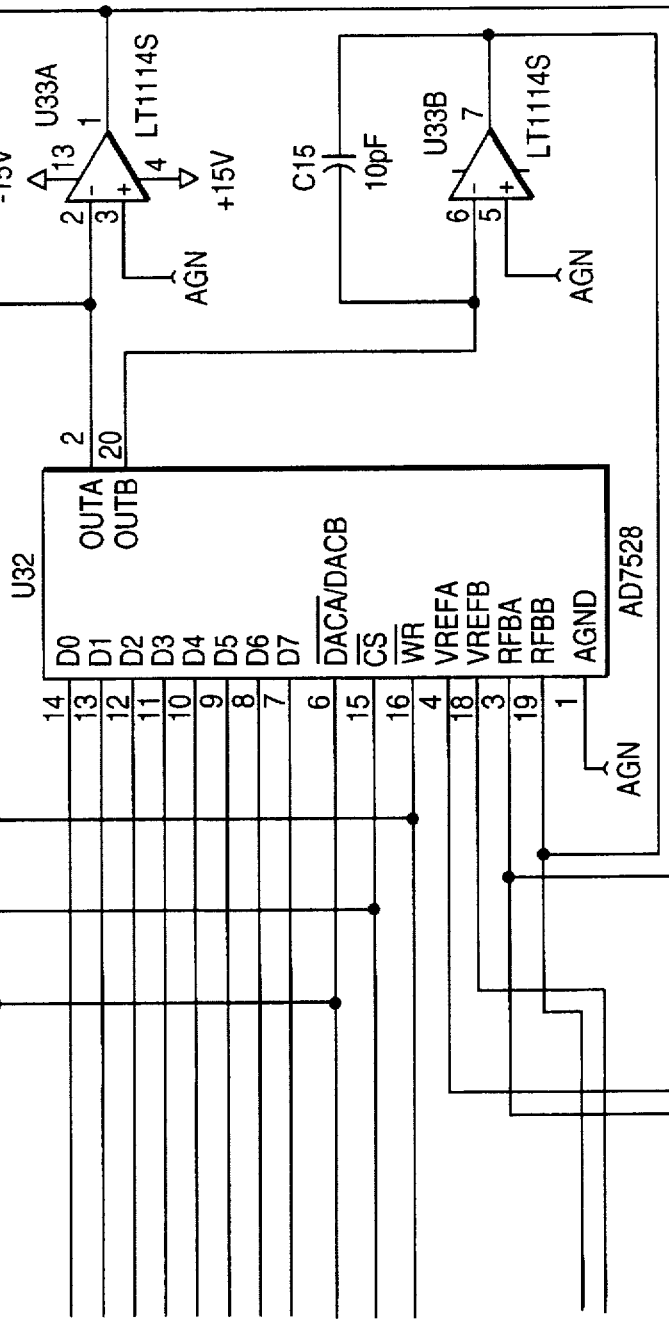
Figure 12E:
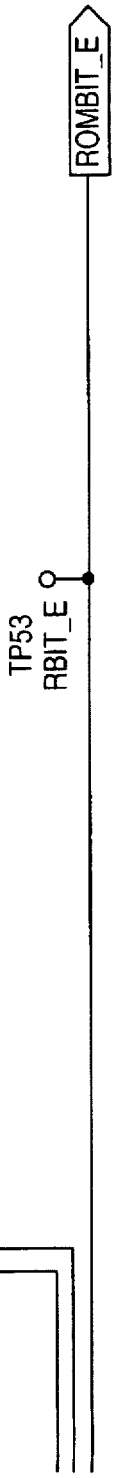
Figure 12F:
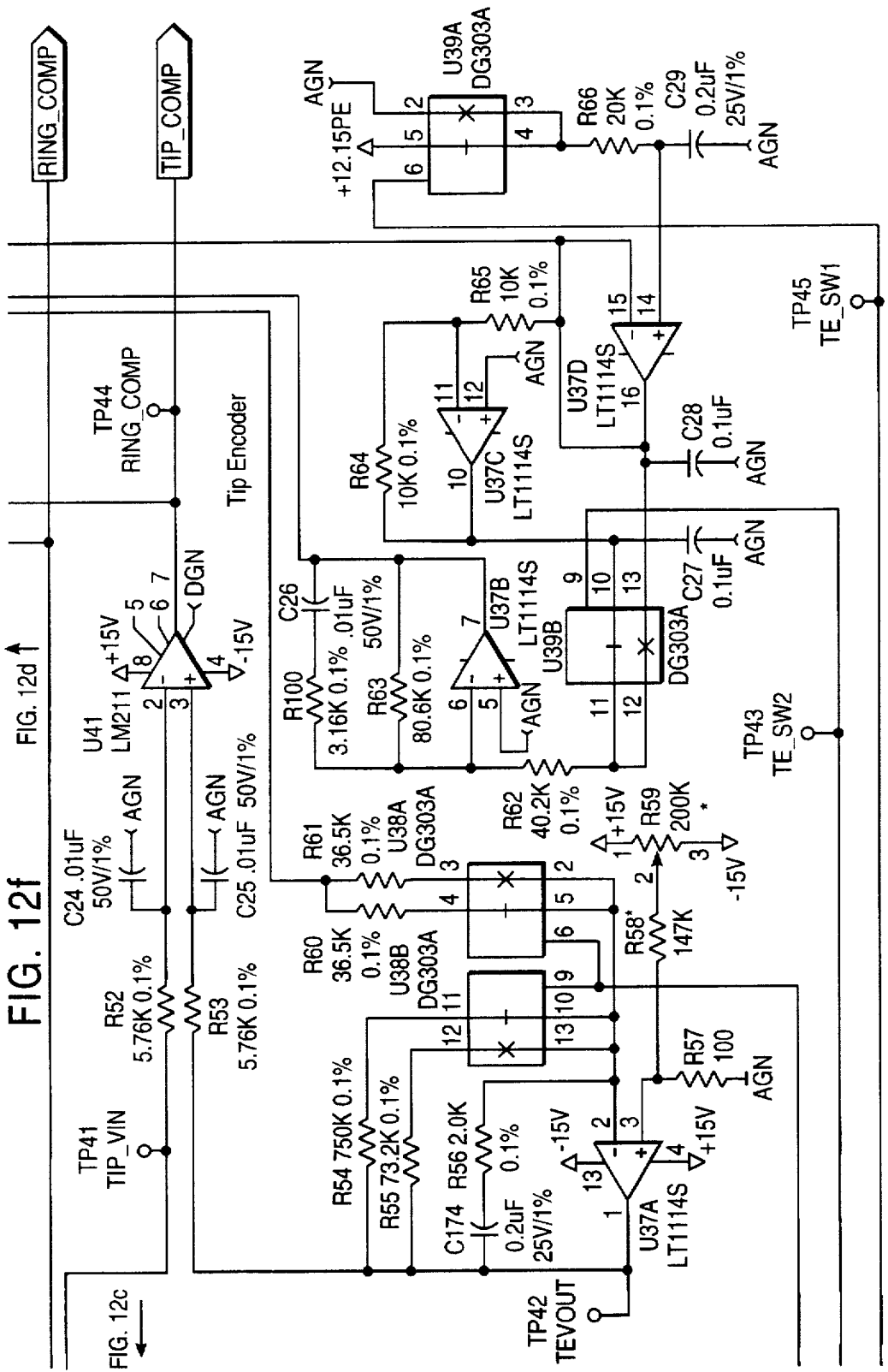

FIG. 11 shows a more specific implementation of the embodiment of the invention shown in FIG. 10. Specifically, the functions of sampler 325 and 3-bit shift register 370, both of FIG. 10, are combined in FIG. 11 in 3-bit shift register 370'. The serial bit stream output, $D_{out}$, is taken from the most recent bit clocked into the shift register 370' by the 24 kHz clock signal. Density logic 455 of FIG. 10 is shown in FIG. 11 as PROM 455a and switch 455b, where $V_{ref}$ is approximately 12 v. Inverting unity gain amplifier 345 of FIG. 10 is implemented with a comparator and resistors, $R_3$ and $R_4$. Integrator 490 of FIG. 10 is implemented in FIG. 11 with $R_7$ and $C_6$. In addition, $R_6$ and $R_7$ form a voltage divider to bring the voltage down from 0–12v to 0–5v, so that it can be handled by a standard A/D converter. Integrator 485 of FIG. 10 is implemented in FIG. 11 as an active circuit having an amplifier, $R_0$, $R_5$,$C_5$,and $R_{12}$. Integrator 355 of FIG. 10 is also implemented in FIG. 11 as an active circuit composed of an amplifier, $R_{10}$, $R_8$, $C_8$, and $R_9$.

For an input signal of 300 Hz–2000 Hz, with an amplitude ranging from 10mV–100mV (a talk mode) the following values are used in the circuit of FIG. 11 to obtain optimized results:

| | |
|---|---|
| $R_1$ | 5.76k |
| $C_1$ | 0.01 uF |
| $R_2$ | 20k |
| $C_2$ | 0.2 uF |
| $R_3$ | 10k |
| $R_4$ | 10k |
| $R_5$ | 80.6k |
| $C_5$ | 0.01 uF |
| $R_{12}$ | 3.16k |
| $R_6$ | 6.81k |
| $C_6$ | 0.2 uF |

| -continued | |
|---|---|
| $R_7$ | 9.53k |
| $R_8$ | 2k |
| $C_8$ | 0.2 uF |
| $R_9$ | 750k |
| $R_{10}$ | 36.5k |
| $R_{11}$ | 5.76k |
| $C_{11}$ | 0.01 uF |

For a DC to 200 Hz input signal ranging from 0–12v in amplitude (a measurement mode), all of the above values are the same except $R_9$ is 73.2k.

The above resistor and capacitor values are chosen in the following general manner. First the gain and component values needed for the final integration stage (integrator 355) are determined. If the frequency and amplitude ranges of $V_{in}$ are known, then the time constant and gain for integrator 355 can be chosen so that $V_{in}$ can be followed. Next, the step size generator ($R_2$ and $C_2$) time constant and values are chosen. Finally, other values are chosen, generally depending on the desired positions of various poles and zeros The following equations are also useful in describing the operation of the circuit in FIG. 11, where n=1 ... N and T=24 kHz=1/24000 sec. The output of the step size generating integrator defined by $R_2$ and $C_2$ is $$V2_n = V2_{n-1} \cdot e^{-\frac{T}{R2 \cdot C2}} + V_{ref}\left( 1 - e^{-\frac{T}{R2 \cdot C2}} \right) \cdot SR_{OUT},$$

where $SR_{OUT}$ is the output from PROM 455a and is equal to 0 or 1 The output of unity gain amplifier 340 is $$V3_n = V2_n.$$

and the output of inverting unity gain amplifier 345 is $$V4_n = -\frac{R4}{R3} \cdot V3_n, \text{ where } R3 = R4.$$

At the output of switch 350 is $$V5a_n = V4_n \text{ if } D_{out} = 1,$$

or $$V5a_n = V3_n \text{ if } D_{out} = 0.$$

Because there are an odd number of inverting stages following switch 350 in FIG. 11, i.e., integrator 485, MDAC 480, and integrator 355, $V5a_n$ is chosen so that when $D_{out}=1$, the signal occurring after the final integration stage signal 355 reflects an increasing $V_{in}$, and when $D_{out}=0$, the signal after the final integration stage 355 reflects a decreasing $V_{in}$. Just before MDAC 480 and after integrator 485, the signal is represented as $$V5_n = V5_{n-1} \cdot e^{-\frac{T}{(R5+R12) \cdot C5}} +$$

$$\frac{R5}{R0}\left( \frac{R5}{R5+R12} \cdot e^{-\frac{T}{(R5+R12) \cdot C5}} - 1 \right) V5a_n +$$

$$\left( \frac{R5}{R0} \cdot \frac{R12}{R12+R5} \cdot e^{-\frac{T}{(R5+R12) \cdot C5}} \right) V5a_{n-1}$$

Following integrator 490 and prior to A/D converter 470, the signal is $$V6_n = V6_{n-1} \cdot e^{-\frac{T}{(R6 \cdot R7 \cdot C6)/(R6+R7)}} +$$

$$V3_n \left( \frac{R5}{R6+R7} \left( 1 - e^{-\frac{T}{(R6 \cdot R7 \cdot C6)/(R6+R7)}} \right) \right)$$

The output of A/D converter 470 is $$AD_n = \text{floor}\left( V6_n \cdot \frac{256}{V_{ref2}} \right) \cdot \frac{1}{256}$$

where "floor" represents dropping all digits to the right of the decimal point to obtain an integer value. Out of the MDAC, the signal is represented as $$V7_n = (AD_{n-1} \cdot V5_n)$$

And finally, the feedback signal following integration by integrator 355 is $$V8_n = \left( V8_{n-1} \cdot e^{-\frac{T}{(R8+R9) \cdot C8}} \right) +$$

$$\frac{R9}{R10} \cdot \left( \frac{R9}{R8+R9} \ e^{-\frac{T}{(R8+R9) \cdot C8}} - 1 \right) V7_n +$$

$$\left( \frac{R9}{R10} \cdot \frac{R8}{R8+R9} \cdot e^{-\frac{T}{(R8+R9) \cdot C8}} \right) V7_{n-1}$$

FIGS. 12–16 further demonstrate an embodiment of the invention used in a Metallic Access Test Extension System Architecture, which is described in application Ser. No. 08/652,851, filed on May 23, 1996, and in a Metallic Access Test Extension System Module, which is described in application Ser. No. 08/652,853, filed on May 23, 1996.

Figure 13B:
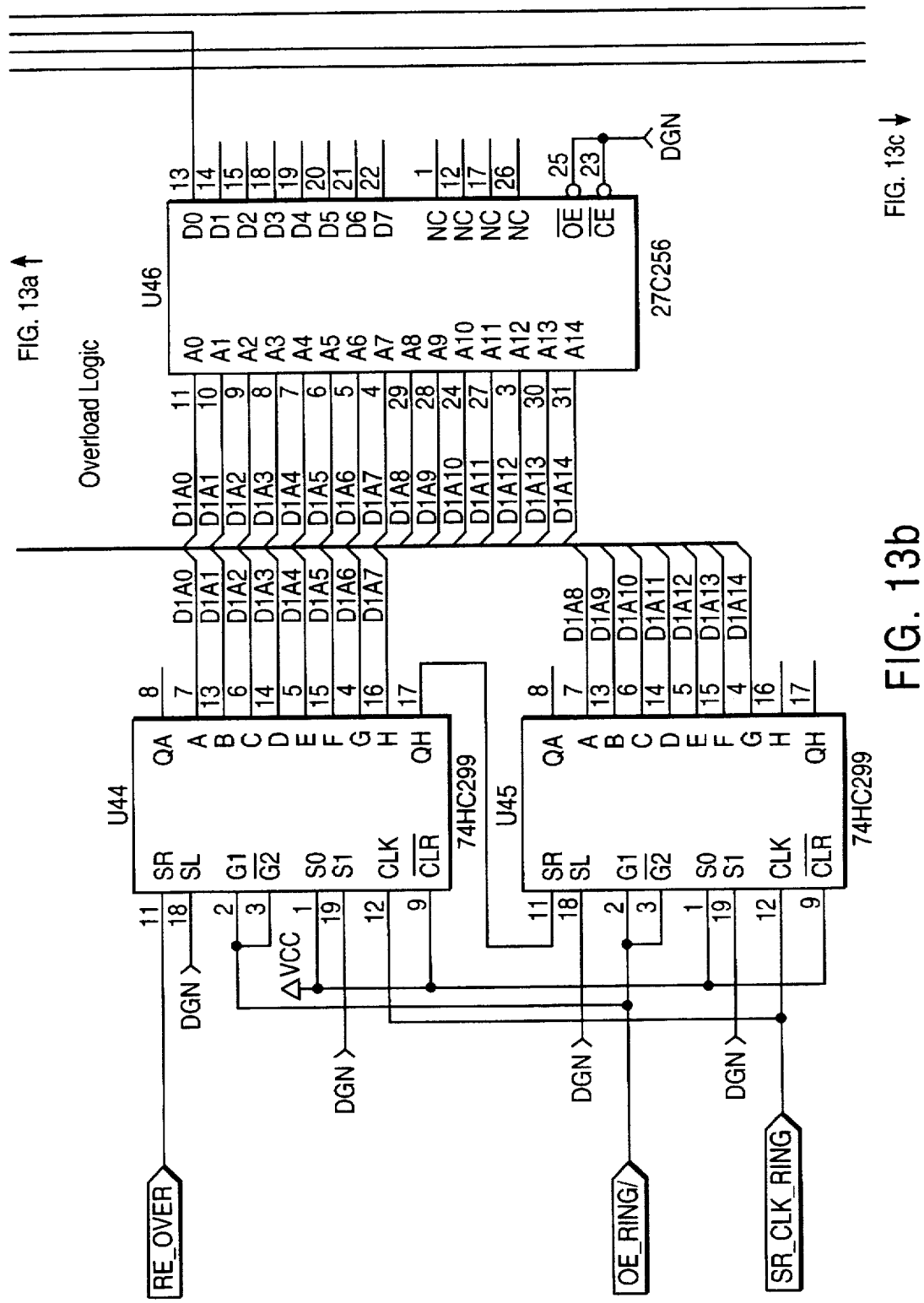
Figure 13D:
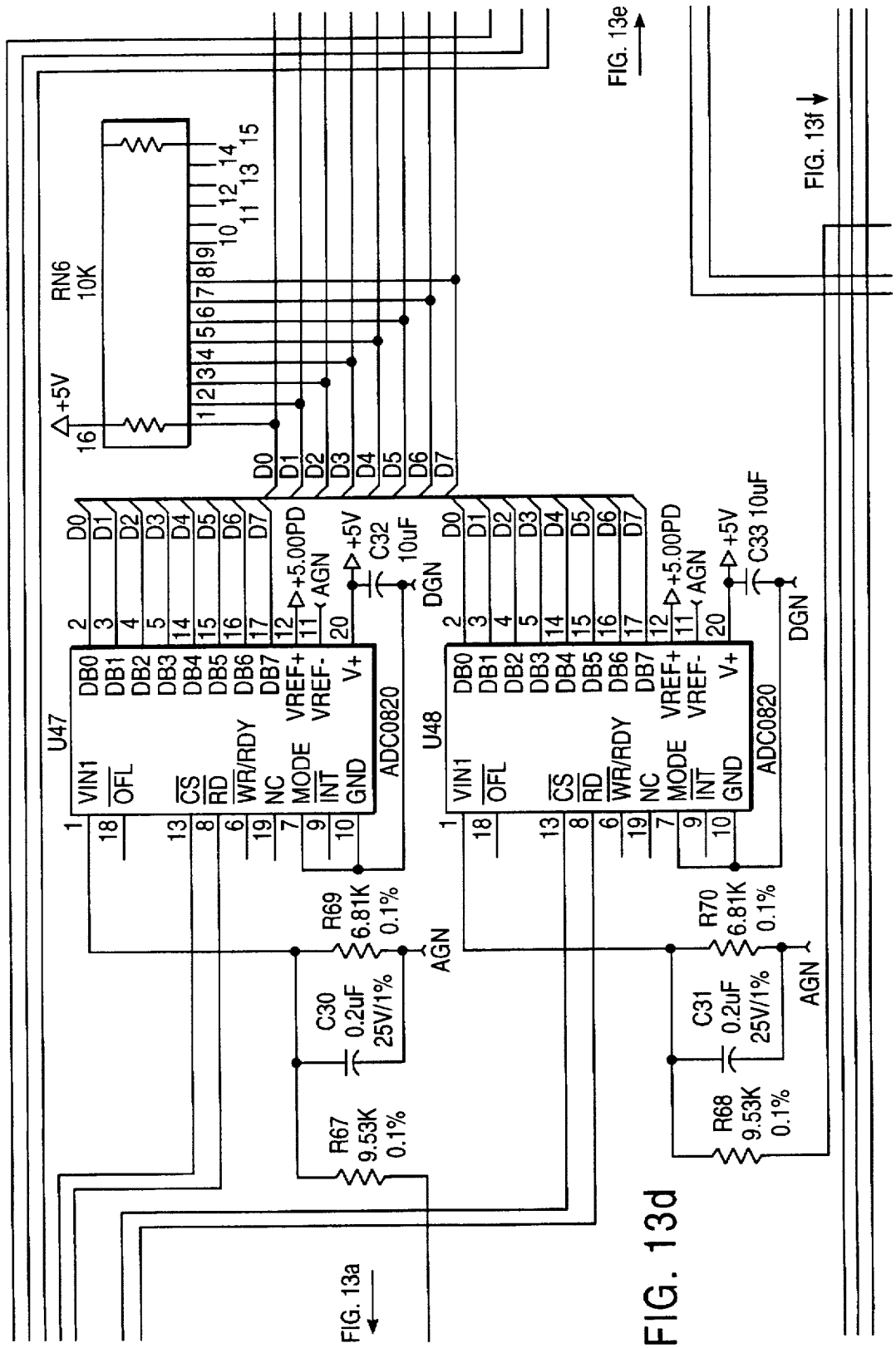
Figure 13E:
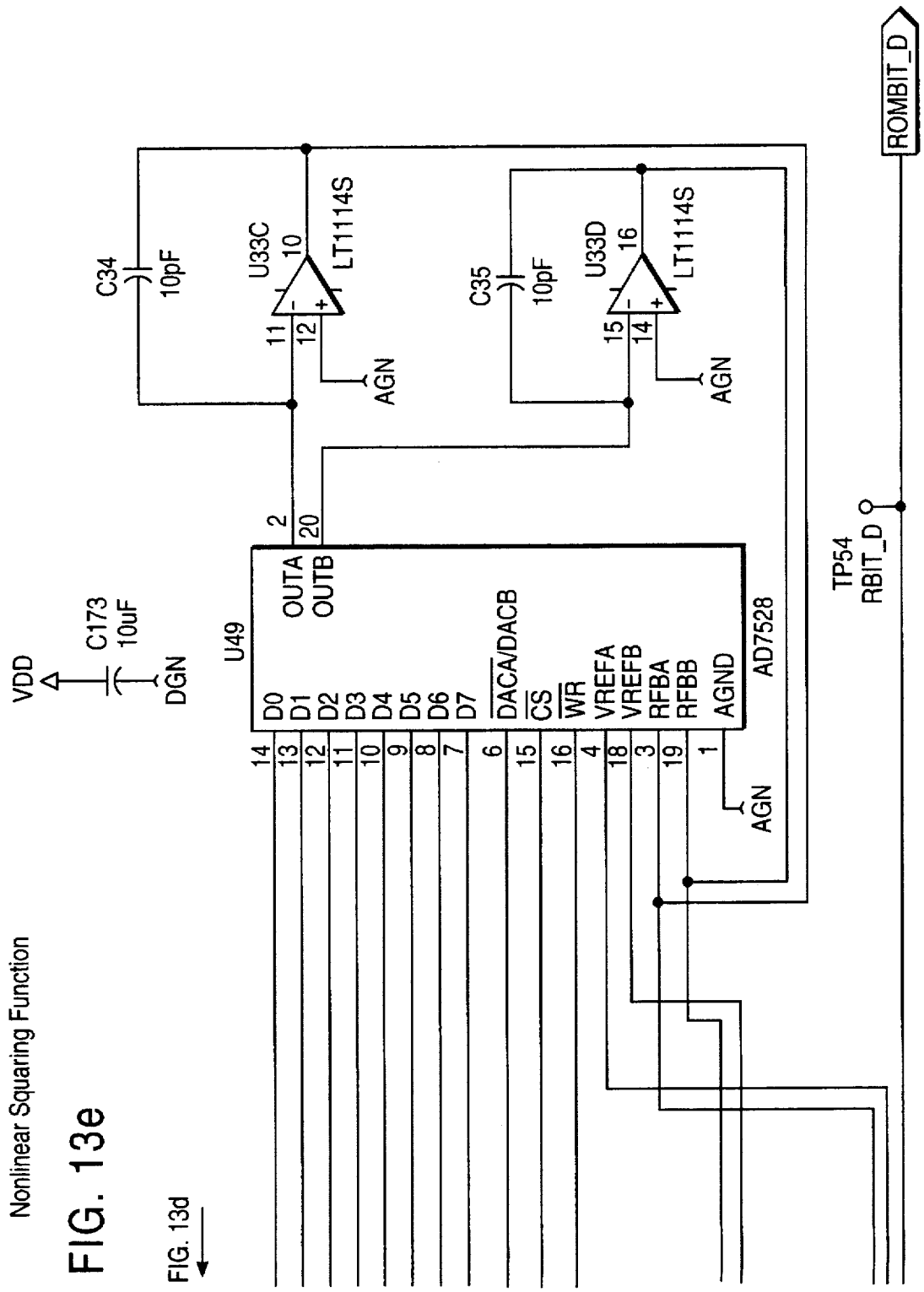

FIGS. 12 and 13 show encoding and decoding circuitry, respectively, in a manner similar to that shown in the embodiment of FIG. 11. In this particular application, two encoders (ring and tip) and two decoders (ring and tip) are utilized. The two encoders (as well as the two decoders) share circuitry in some instances using bus sharing principles.

Figure 14A:
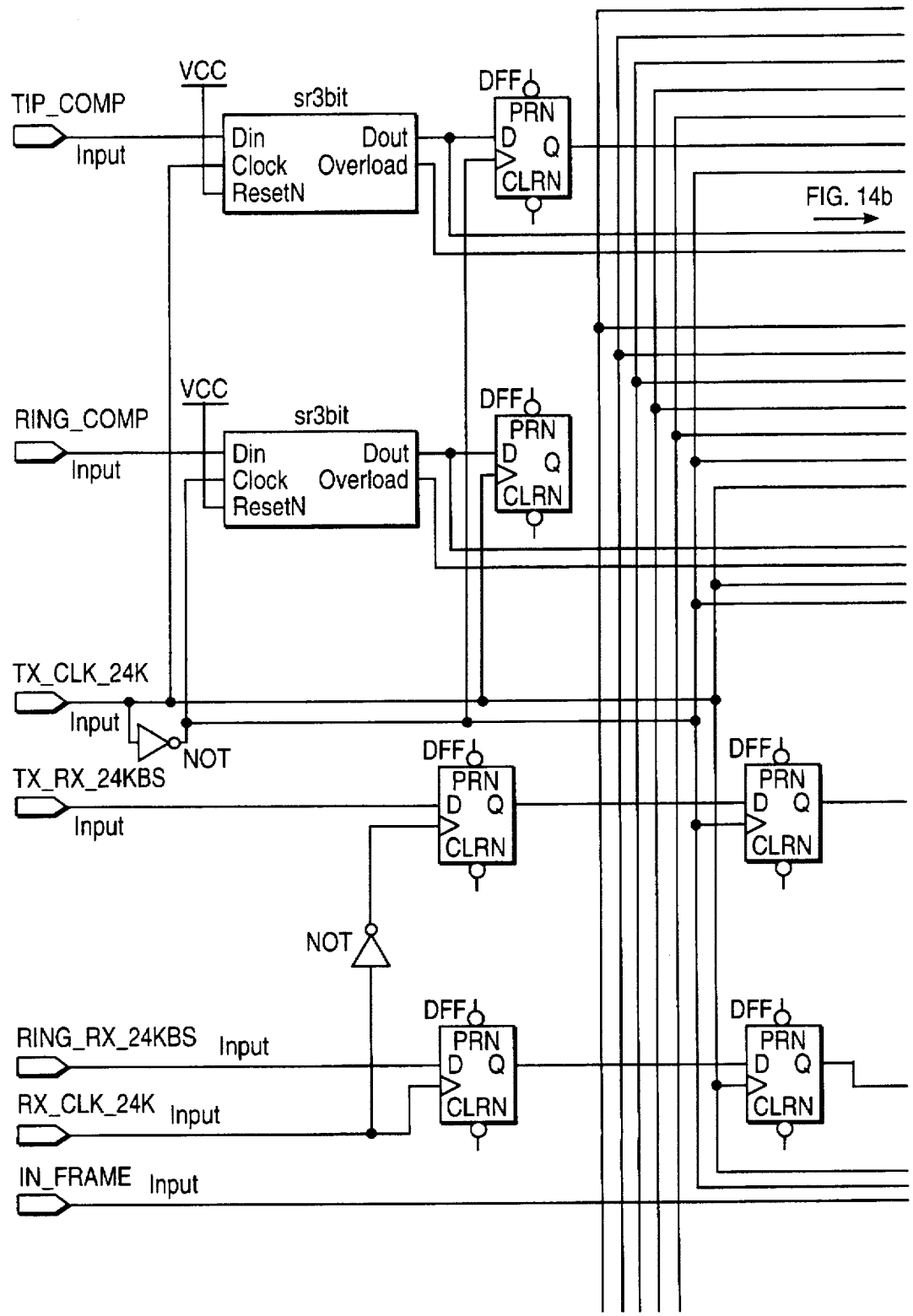
Figure 14B:
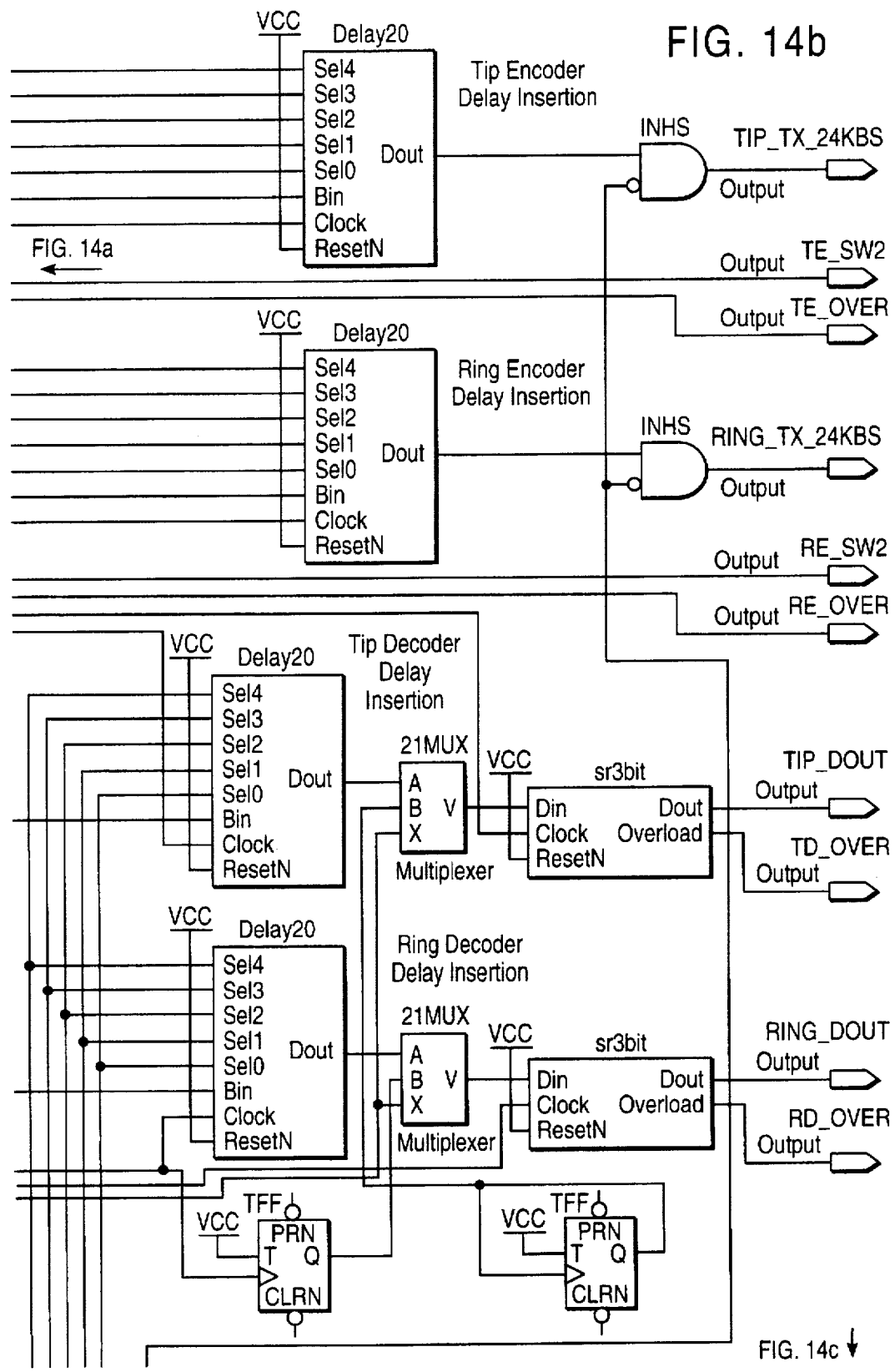
Figure 15:
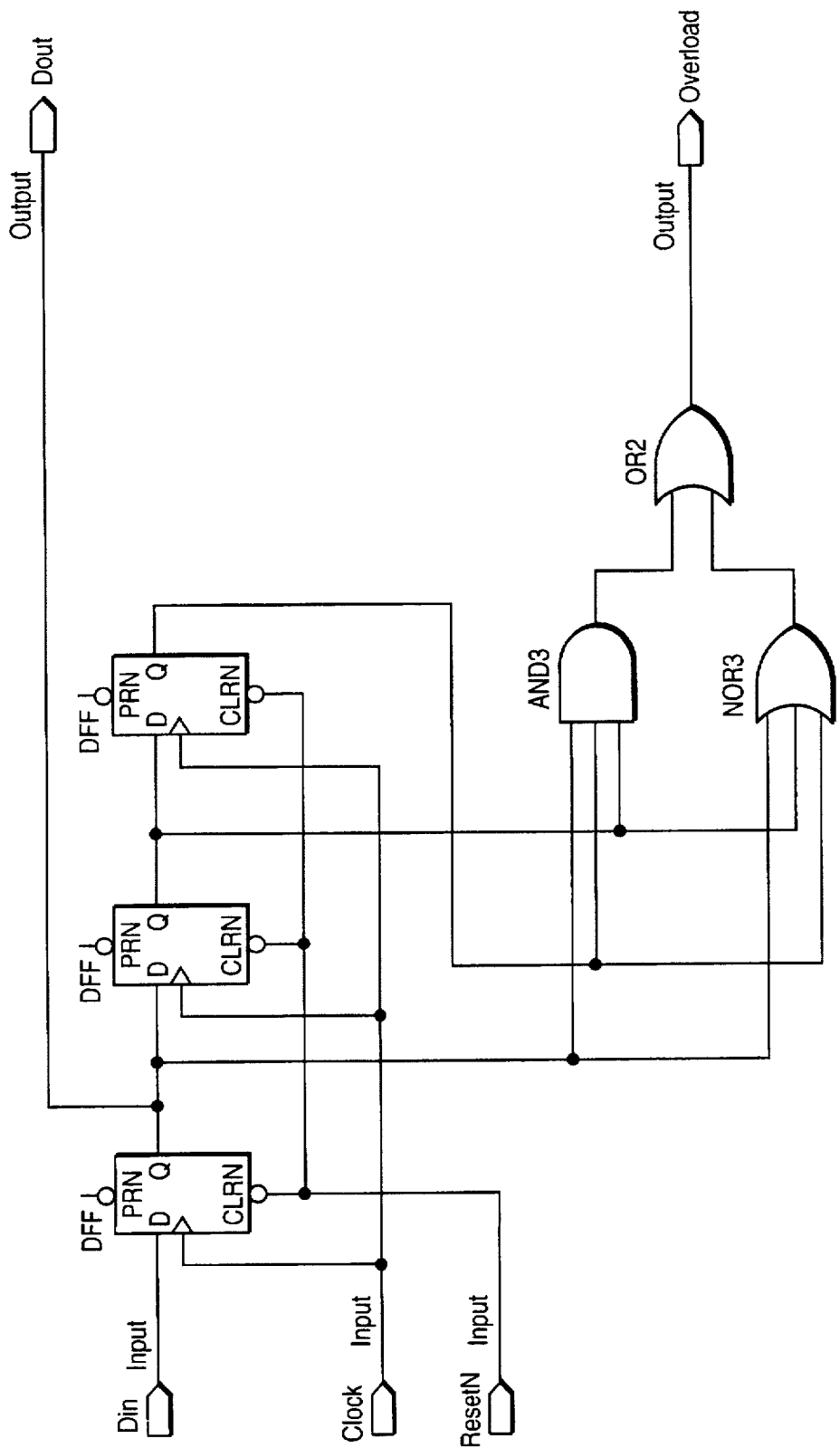

To illustrate operation of the circuitry of FIGS. 12–16, reference will be made to the "ring encoder" circuitry. A "ring_transmit" signal is input into the circuit of FIG. 12 and is analogous to $V_{in}$ in FIG. 11. "Ring_transmit" is received in a comparator whose output is a "ring_comp" signal. "Ring_comp" can be followed to FIG. 14, where it is received by a 3-bit shift register, analogous to 370' in FIG. 11. The architecture of the 3-bit shift register is shown in more detail in FIG. 15 and includes XOR circuitry analogous to XOR gate 375 in FIG. 11. Also shown in FIG. 14, are various optional delay elements. From the 3-bit shift register in FIG. 14 are produced two signals, RE_SW2 (analogous to $D_{out}$ of FIG. 11) and RE_OVER (analogous to the XOR output of FIG. 11). RE_SW2 and RE_OVER are returned to FIG. 12 and RE_OVER is input into a shift register. RE_SW2 controls a switch analogous to switch 350 of FIG. 11. The values in the shift registers are passed to overload logic, which is shown in Fig. 12 as a PROM, which is programmed as discussed with respect to Table 1.

Figure 16A:
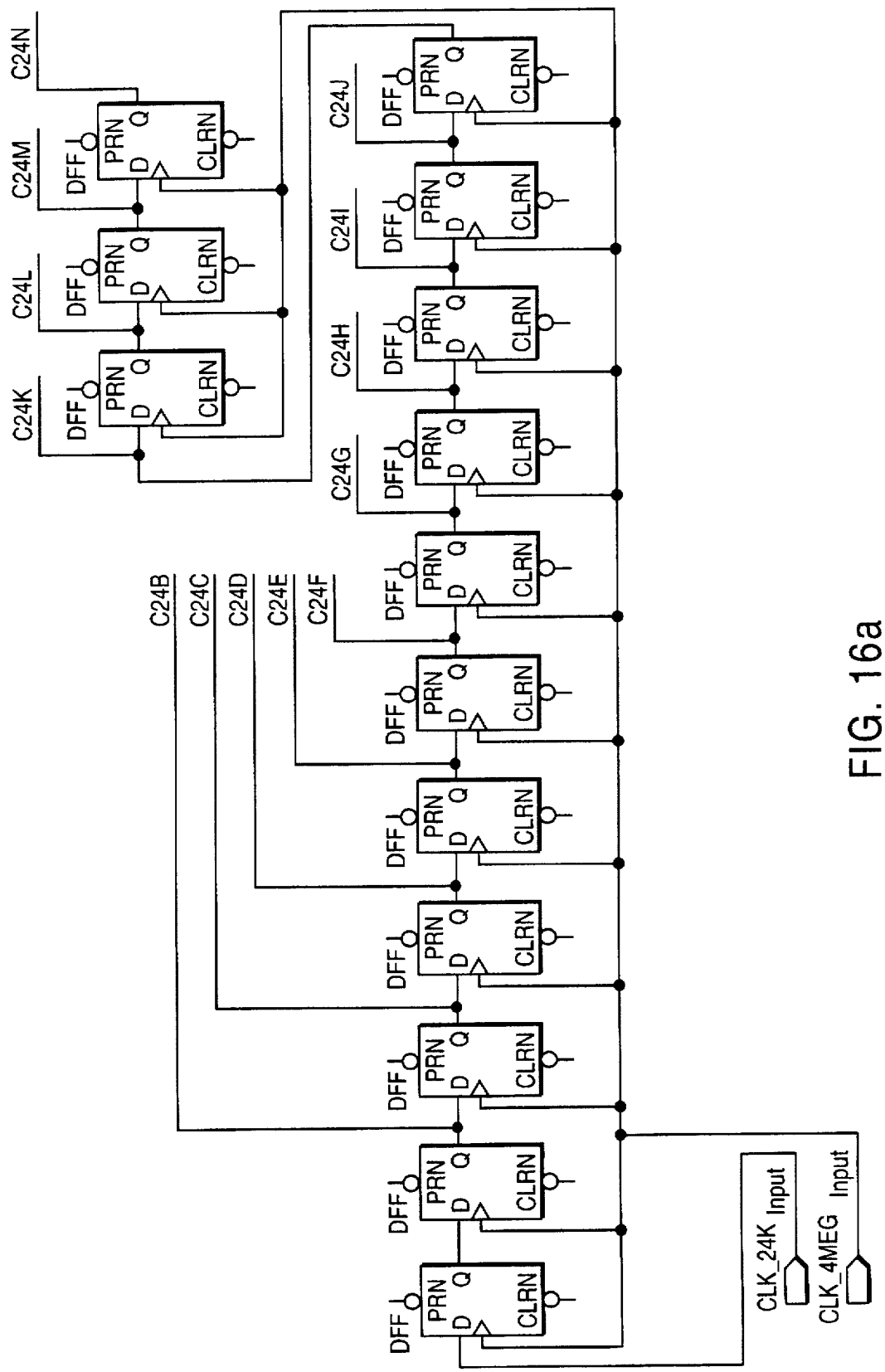
Figure 16B:
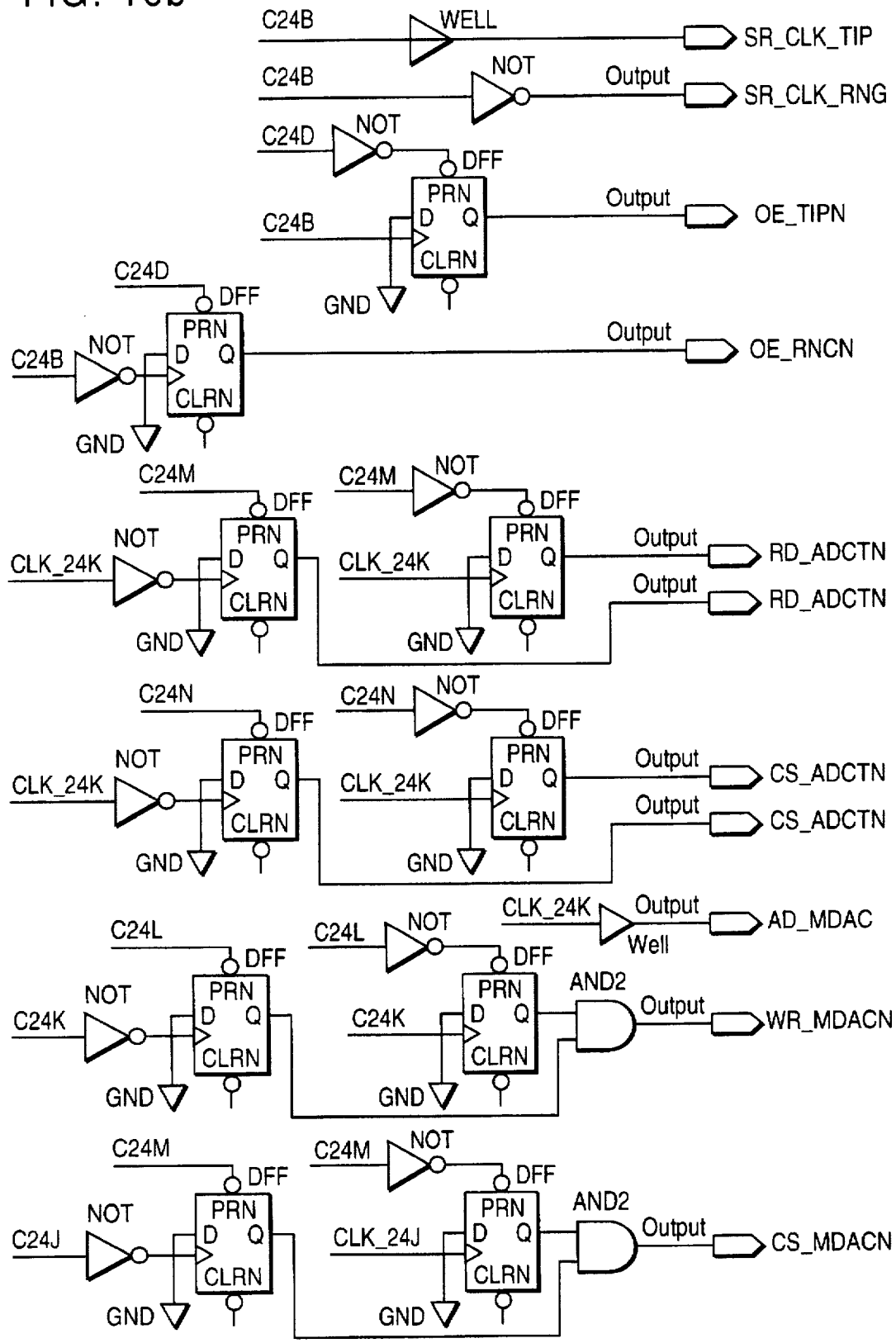
Figure 16C:
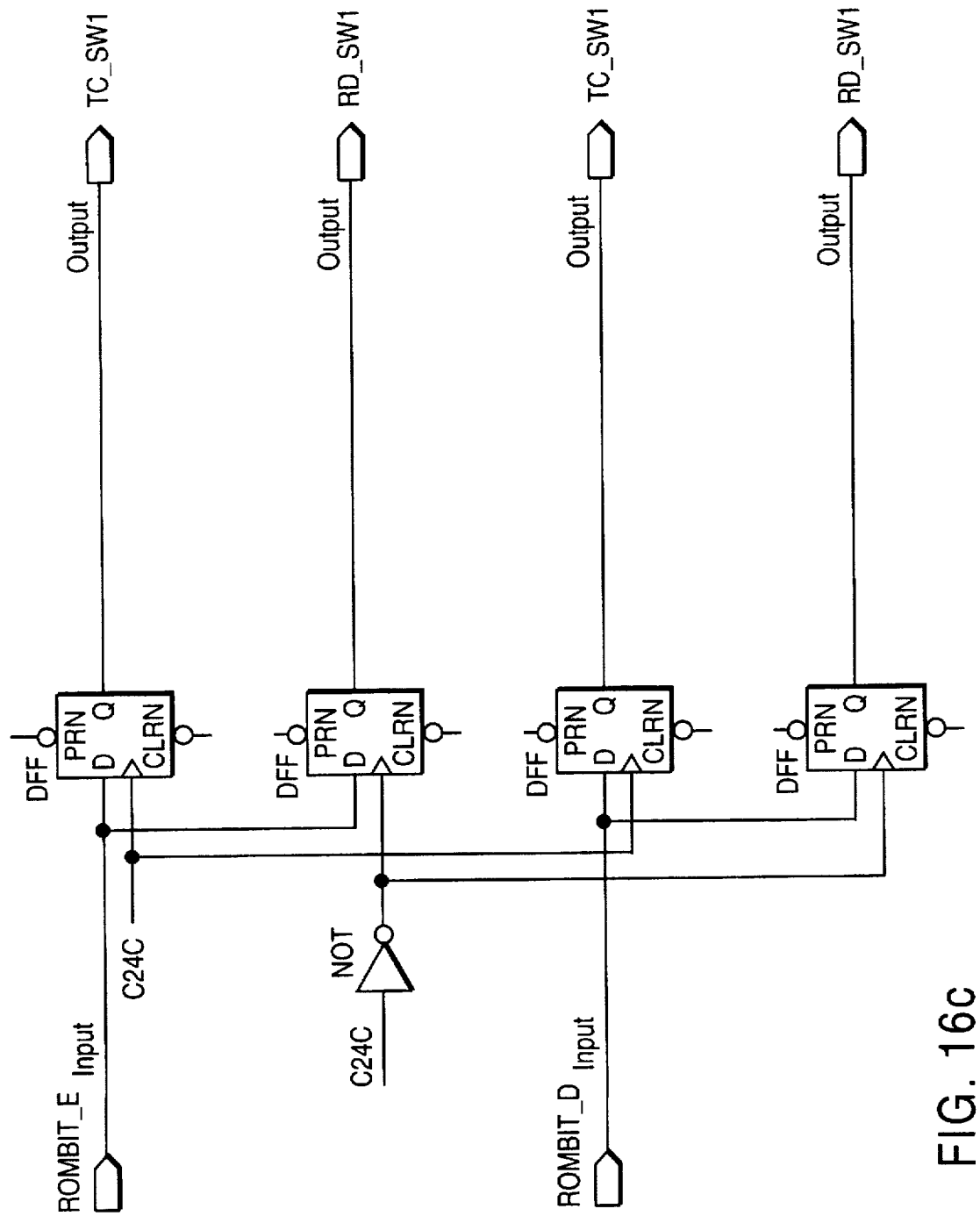

Overload logic outputs a single bit, "rombit_E", which is passed to the circuit of FIG. 16 where it undergoes various timing adjustments and is returned to the circuit of FIG. 12 as RE_SW1, which controls a switch analogous to switch 455b of FIG. 11. Also shown as an input into the circuit of FIG. 12 is "talk_mode", which controls a switch which selects between resistor values and is a signal indicating whether circuit operation is in a talk mode (operating with a $V_{in}$ of approximately 300–2000 Hz and 10 mv–100 mV amplitude) or a measurement mode (operating with a $V_{in}$ of approximately 0–200 Hz and 0–12 v). Other signals input to the circuitry of FIG. 12 come from timing control circuitry shown in FIG. 16. The operation of the remainder of the circuit of FIG. 12 can be generally understood by reference to FIGS. 10 and 11. The decoding circuitry of FIG. 13 operates similarly to that described with respect to FIG. 12.

Thus, a delta modulator has been described in accordance with the invention which demonstrates an improved signal-to-noise ratio over traditional delta modulators. Moreover, a more constant gain over a wider dynamic range of the input signal is achieved over that found in traditional delta modulators. In addition, the delta modulator in accordance with the invention improves immunity of gain variation to offset voltages.

It should be understood that the particular embodiments described above are only illustrative of the principles of the present invention, and various modifications could be made by those skilled in the art without departing from the scope and spirit of the invention. For instance, integrators indicated as passive R-C circuits could be replaced in some instances with active circuits utilizing amplifiers, resistors and capacitors. Thus, the scope of the present invention is limited only by the claims that follow.

What is claimed is:

1. A modulator, comprising:
   overload detecting means for monitoring bits received at an input, said overload detecting means producing an overload output signal indicative of an overload condition, said overload output signal comprising a first pulse train having a first set of duty cycles;
   modulation level regulating means for producing, in response to said overload output signal, a regulated overload signal to indicate whether said overload condition has reached at least a particular threshold, said regulated overload signal comprising a second pulse train having a set of regulated duty cycles with less variation than said first set of duty cycles; and
   step size generating means for generating step signals of varying size in response to said regulated overload signal.

2. The modulator of claim 1, wherein said particular threshold is a constant index value.

3. The modulator of claim 1, wherein said particular threshold is a ones-bit density threshold.

4. The modulator of claim 3, wherein said modulation level regulating means includes:
   a shift register coupled to receive said overload output signal; and
   density logic coupled to said shift register.

5. The modulator of claim 4, wherein said density logic is a PROM programmed to determine whether said ones-bit density threshold has been reached in said shift register.

6. The modulator of claim 1, wherein said particular threshold is a voltage threshold.

7. The modulator of claim 6, wherein said modulation level regulating means includes:
   an integrator, coupled to receive said overload output signal and producing an integrated overload output signal; and
   a comparator, having a first input coupled to receive said integrated overload output signal, having a second input coupled to a reference threshold voltage, and having a comparator output to carry said regulated overload signal.

8. The modulator of claim 1, further including non-linear shaping circuitry, coupled to said step size generating means.

9. The modulator of claim 8, wherein said non-linear shaping circuitry includes:
   an analog-to-digital converter; and
   a multiplying digital-to-analog converter coupled to said analog-to-digital converter.

10. The modulator of claim 1, further including:
    a polarity switching circuit coupled to said step size generating means; and
    non-linear shaping circuitry coupled to said polarity switching circuit.

11. The modulator of claim 10, wherein said non-linear shaping circuitry includes:
    an analog-to-digital converter; and
    a multiplying digital-to-analog converter coupled to said analog-to-digital converter.

12. The modulator of claim 1 wherein:
    said step signals generated by said step size generating means represent an average value of said regulated overload signal over a time constant.

13. A delta modulator, comprising:
    a first shift register;
    exclusive-OR circuitry coupled to said first shift register, said exclusive-OR circuitry having an output for carrying a first pulse train having a first set of duty cycles;
    modulation level regulation circuitry coupled to said output of said exclusive-OR circuitry, said modulation level regulation circuitry having an output for carrying a regulated pulse train having a set of duty cycles with less variation than said first set of duty cycles, wherein said regulated pulse train indicates whether said first set of duty cycles has reached at least a particular threshold; and
    a first integrator coupled to said output of said modulation level regulation circuitry.

14. The delta modulator of claim 13, wherein said modulation level regulation circuitry includes:
    a second shift register coupled to said output of said exclusive-OR circuitry; and
    density logic coupled to said second shift register for monitoring the number of one bits in said second shift register and producing said regulated pulse train, wherein said regulated pulse train is indicative of whether the number of one bits is at least a threshold density.

15. The delta modulator of claim 14, wherein said density logic is implemented in a PROM.

16. The delta modulator of claim 13, wherein said modulation level regulation circuitry includes:
    a second integrator coupled to said output of said exclusive-OR circuitry; and
    a comparator, having a first input and a second input, said second integrator coupled to said first input, and a reference voltage coupled to said second input.

17. The delta modulator of claim 13, further including
    an analog-to-digital converter coupled to said first integrator;
    a multiplying digital-to-analog converter coupled to said analog-to-digital converter and coupled to said first integrator; and
    a polarity switching circuit coupled to said multiplying digital-to-analog converter.

18. The delta modulator of claim 13, further including:
    a polarity switching circuit coupled to said first integrator;
    an analog-to-digital converter coupled to said polarity switching circuit; and
    a multiplying digital-to-analog converter coupled to said analog-to-digital converter.

19. The delta modulator of claim 18, wherein said analog-to-digital converter is coupled to said polarity switching circuit through a second integrator.

20. A modulator, comprising:
    a step size controller, having a step size controller output;
    a polarity switching circuit coupled to said step size controller output; and
    a non-linear shaping network coupled to said polarity switching circuit, said non-linear shaping network including:
       an analog-to-digital converter; and
       a multiplying digital-to-analog converter coupled to said analog-to-digital converter.

21. The modulator of claim 20, wherein said non-linear shaping network is included in said step size controller, said non-linear shaping network having an output which forms said step size controller output.

22. The modulator of claim 20, wherein
    said non-linear shaping network is coupled to said polarity switching circuit through an integrator.

23. A modulator, comprising:
    a step size controller, having a step size controller output;
    a polarity switching circuit coupled to said step size controller output, said polarity switching circuit having a first output; and
    a non-linear shaping network coupled to said first output of said polarity switching circuit.

24. The modulator of claim 23, wherein said non-linear shaping network is coupled to said first output of said polarity switching circuit through a first integrator.

25. The modulator of claim 23, wherein said non-linear shaping network includes:
    an analog-to-digital converter; and
    a multiplying digital-to-analog converter.

26. A delta modulator, comprising:
    a step size controller, having a step size controller output, said step size controller including:
       an overload detector having an overload detector output to carry a first pulse train;
       a modulation level regulator coupled to said overload detector output and having a modulation level regulator output to carry a regulated pulse train; and
       a step size generator coupled to said modulation level regulator output;
    a polarity switching circuit coupled to said step size controller output; and
    a non-linear shaping network coupled to said polarity switching circuit, said non-linear shaping network, including:
       an analog-to-digital converter; and
       a multiplying digital-to-analog converter coupled to said analog-to-digital converter.

27. The delta modulator of claim 26, wherein said modulation level regulator includes:
    a shift register; and
    density logic coupled to said shift register for determining if at least a threshold ones-density has been reached in said shift register.

28. The delta modulator of claim 26, wherein said modulation level regulator includes:

an integrator; and a comparator, having a first input coupled to said integrator, having a second input coupled to a reference threshold voltage, and having an output coupled to said step size generator, wherein said output is said modulation level regulation output.

29. The delta modulator of claim 26, wherein:

said non-linear shaping network is coupled to said polarity switching circuit through an integrator.

30. The delta modulator of claim 26, wherein said non-linear shaping network is included in said step size controller and is coupled to said step size generator, said non-linear shaping network having an output which forms said step size controller output.

31. A modulator, comprising:

an overload detector having an overload detector output to carry an overload output signal indicative of an overload condition, said overload output signal comprising a first pulse train having a first set of duty cycles;

a modulation level regulator coupled to said overload detector output and having a modulation level regulator output to carry a regulated pulse train indicative of whether said overload condition has reached at least a particular threshold, said regulated pulse train having a set of duty cycles with less variation than said first set of duty cycles; and a step size generator coupled to said modulation level regulator output to generate a step signal in response to said regulated pulse train.

32. The modulator of claim 31, wherein said step signal is an average of said regulated pulse train.

33. The modulator of claim 32, wherein said modulation level regulator includes:

a shift register coupled to said overload detector output; and density logic coupled to said shift register.

34. The modulator of claim 33, wherein said particular threshold is a ones-bit density in said shift register and wherein said density logic has an output for carrying a signal indicative of whether said particular threshold has at least been reached in said shift register.

35. The modulator of claim 32, wherein said modulation regulator includes:

an integrator coupled to said overload detector output and having an integrator output to carry an integrated overload output signal; and a comparator, having a first input coupled to said integrator and a second input coupled to a reference voltage.

36. The modulator of claim 35, wherein said particular threshold is said reference voltage and wherein said comparator has an output for carrying a signal indicative of whether said integrated overload output signal has reached at least said reference voltage.

37. The modulator of claim 31, wherein:

said overload detector includes a shift register and an exclusive-OR gate; and said step size generator includes an integrator.

* * * * *